United States Patent
Yamazaki et al.

(10) Patent No.: US 9,484,467 B2
(45) Date of Patent: Nov. 1, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Kiyoshi Kato, Atsugi (JP); Masakazu Murakami, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/930,081

(22) Filed: Nov. 2, 2015

(65) Prior Publication Data

US 2016/0056298 A1 Feb. 25, 2016

Related U.S. Application Data

(63) Continuation of application No. 13/751,783, filed on Jan. 28, 2013, now Pat. No. 9,196,741.

(30) Foreign Application Priority Data

Feb. 3, 2012 (JP) .................................. 2012-022514
Mar. 14, 2012 (JP) .................................. 2012-058036

(51) Int. Cl.
*H01L 21/34* (2006.01)
*H01L 29/24* (2006.01)
(Continued)

(52) U.S. Cl.
CPC ..... *H01L 29/7869* (2013.01); *H01L 29/41733* (2013.01); *H01L 29/42384* (2013.01); *H01L 29/45* (2013.01)

(58) Field of Classification Search
CPC ........ H01L 21/34; H01L 29/78; H01L 29/24

USPC ............ 257/412, 288, E29.255, E21.41, 79, 257/411; 438/149, 104; 502/11, 242, 244, 502/243, 200, 201, 183.14; 422/186, 162

See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Kimizuka.N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000°C.", Journal of Solid State Chemistry, 1985, vol. 60, pp. 382-384.

(Continued)

*Primary Examiner* — David Vu
*Assistant Examiner* — Mouloucoulaye Inoussa
(74) *Attorney, Agent, or Firm* — Robinson Intellectual Property Law Office; Eric J. Robinson

(57) ABSTRACT

A semiconductor device with significantly low off-state current is provided. An oxide semiconductor material in which holes have a larger effective mass than electrons is used. A transistor is provided which includes a gate electrode layer, a gate insulating layer, an oxide semiconductor layer including a hole whose effective mass is 5 or more times, preferably 10 or more times, further preferably 20 or more times that of an electron in the oxide semiconductor layer, a source electrode layer in contact with the oxide semiconductor layer, and a drain electrode layer in contact with the oxide semiconductor layer.

22 Claims, 15 Drawing Sheets

(51) Int. Cl.
*H01L 29/786* (2006.01)
*H01L 29/417* (2006.01)
*H01L 29/423* (2006.01)
*H01L 29/45* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0163585 A1 | 7/2006 | Ando et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2011/0108833 A1 | 5/2011 | Yamazaki et al. |
| 2011/0151618 A1 | 6/2011 | Yamazaki et al. |
| 2011/0193182 A1* | 8/2011 | Takemura ........... H01L 27/0629 257/412 |
| 2013/0174884 A1* | 7/2013 | Grayson ................ H01L 35/28 136/203 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 A | 5/2007 |
| JP | 2011-171702 A | 9/2011 |
| WO | WO-2004/114391 | 12/2004 |

OTHER PUBLICATIONS

Sekine.Y et al., "Success in Measurement the Lowest Off-State Current of Transistor in the World", ECS Transactions, 2011, vol. 37, No. 1, pp. 77-88.

Murakami.M et al., "Theoretical Examination on a Significantly Low Off-State Current of a Transistor Using Crystalline In—Ga—Zn—Oxide", AM-FPD '12 Digest of Technical Papers, Jul. 4, 2012, pp. 171-174.

Murakami.M et al., "Theoretical Examination on Significantly Low Off-State Current of a Transistor Using Crystalline In—Ga—Zn—Oxide", Extended Abstracts of the 2012 International Conference on Solid State Devices and Materials, Sep. 26, 2012, pp. 320-321.

Fortunato.E at al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K at al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M at al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350°C.", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5Δ) Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers, Jul 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer", SID

(56) References Cited

OTHER PUBLICATIONS

Digest '09 : SID International Symposium Digest of Technical Papers, May 31, 2009, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED ", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No.2, pp. 800-803.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

The present invention relates to a technique for miniaturizing semiconductor integrated circuits. The invention disclosed in this specification includes in its scope an element formed using a compound semiconductor, in addition to that formed using a silicon semiconductor, as a component of a semiconductor integrated circuit, and discloses an element formed using a wide-gap semiconductor as an example.

In this specification, a semiconductor device generally means a device which can function by utilizing semiconductor characteristics, and an electro-optical device, a semiconductor circuit, and an electronic device are all semiconductor devices.

2. Description of the Related Art

Oxide semiconductors have recently attracted attention as materials for next-generation thin film transistors. Examples of oxide semiconductors include tungsten oxide, tin oxide, indium oxide, zinc oxide, and the like, and there are known thin film transistors in which such oxide semiconductors are used in channel formation regions.

Examples of oxide semiconductors include not only a single-component metal oxide but also a multi-component metal oxide. In particular, an In—Ga—Zn—O-based oxide material (hereinafter also referred to as IGZO) has been actively studied. Crystal structures of IGZO were found in 1985 by Kimizuka, Nakamura, Lee, et al. from National Institute for Research in Inorganic Materials, and Non-Patent Document 1 shows that IGZO has homologous structures represented by $InGaO_3(ZnO)_m$ (m=1 to n).

It has also been confirmed that an oxide semiconductor including such IGZO can also be applied to a channel formation region of a thin film transistor (see, for example, Patent Document 1).

In addition, in Patent Document 2, the off-state current of a transistor formed using an oxide semiconductor including IGZO (L/W=10 μm/50 μm) is calculated to be 100 zA/μm or less.

[Patent Document 1] Japanese Published Patent Application No. 2007-123861

[Patent Document 2] Japanese Published Patent Application No. 2011-171702

[Non-Patent Document 1]

N. Kimizuka and T. Mohri, "Spinel, $YbFe_2O_4$, and $Yb_2Fe_3O_7$ Types of Structures for Compounds in the $In_2O_3$ and $Sc_2O_3-A_2O_3$—BO Systems [A: Fe, Ga, or Al; B: Mg, Mn, Fe, Ni, Cu, or Zn] at Temperatures over 1000° C.", J. Solid State Chem., 1985, Vol. 60, pp. 382-384

SUMMARY OF THE INVENTION

A variety of semiconductor integrated circuits are used in a variety of electronic devices. Semiconductor integrated circuits such as a CPU and a driver circuit can provide electronic devices with a variety of functions, facilitating decreases in size and increases in functionality of electronic devices. For example, an increase in off-state current of a transistor formed using a silicon substrate results in an increase in power consumption of a semiconductor device. An increase in off-state current of a transistor used in a logic circuit may cause a change in voltage value of an output signal even when the voltage value of the output signal should be kept within a certain range, and this may lead to malfunction.

Therefore, it is an object to provide a semiconductor device with significantly low off-state current.

The use of a wide-gap semiconductor in which holes have a large effective mass makes it possible to obtain a semiconductor device with significantly low off-state current.

Specifically, an oxide semiconductor material in which holes have a larger effective mass than electrons is used. An example of such an oxide semiconductor material is a material which contains at least indium and contains one or more elements selected from gallium, tin, titanium, zirconium, hafnium, zinc, and germanium.

One embodiment of the invention disclosed in this specification is a semiconductor device including a transistor which includes a gate electrode layer, a gate insulating layer, an oxide semiconductor layer including a hole whose effective mass is 5 or more times, preferably 10 or more times, further preferably 20 or more times that of an electron, a source electrode layer in contact with the oxide semiconductor layer, and a drain electrode layer in contact with the oxide semiconductor layer. In the semiconductor device, the off-state current density of the transistor per micrometer in channel width is 100 zA/μm or less, preferably 1 zA/μm or less, further preferably 100 yA/μm or less. Note that the off-state current refers to a current which flows between the source electrode layer and the drain electrode layer when the transistor is off.

In the above embodiment, the channel length of the transistor may be greater than or equal to 5 nm and less than or equal to 500 nm.

In the above embodiment, the band gap of the oxide semiconductor layer may be greater than or equal to 2 eV and less than or equal to 4 eV.

In the above embodiment, the carrier density in a channel formation region of the transistor may be greater than or equal to $10^{-10}/cm^3$ and less than $10^{17}/cm^3$ in a state where a flat band potential is applied as a gate voltage.

In the above embodiment, the channel formation region of the transistor may include a c-axis-aligned crystal.

An oxide semiconductor film may be in a non-single-crystal state, for example. The non-single-crystal state is, for example, structured by at least one of c-axis aligned crystal (CAAC), polycrystal, microcrystal, and an amorphous part. The density of defect states of an amorphous part is higher than those of microcrystal and CAAC. The density of defect states of microcrystal is higher than that of CAAC. Note that an oxide semiconductor including CAAC is referred to as a CAAC-OS (c-axis aligned crystalline oxide semiconductor).

For example, an oxide semiconductor film may include a CAAC-OS. In the CAAC-OS, for example, c-axes are aligned, and a-axes and/or b-axes are not macroscopically aligned.

For example, an oxide semiconductor film may include microcrystal. Note that an oxide semiconductor including microcrystal is referred to as a microcrystalline oxide semiconductor. A microcrystalline oxide semiconductor film includes microcrystal (also referred to as nanocrystal) with a size greater than or equal to 1 nm and less than 10 nm, for example. Alternatively, a microcrystalline oxide semiconductor film, for example, includes a crystal-amorphous mixed phase structure where crystal parts (each of which is greater than or equal to 1 nm and less than 10 nm) are distributed.

For example, an oxide semiconductor film may include an amorphous part. Note that an oxide semiconductor including an amorphous part is referred to as an amorphous oxide semiconductor. An amorphous oxide semiconductor film, for example, has disordered atomic arrangement and no crystalline component. Alternatively, an amorphous oxide semiconductor film is, for example, absolutely amorphous and has no crystal part.

Note that an oxide semiconductor film may be a mixed film including any of a CAAC-OS, a microcrystalline oxide semiconductor, and an amorphous oxide semiconductor. The mixed film, for example, includes a region of an amorphous oxide semiconductor, a region of a microcrystalline oxide semiconductor, and a region of a CAAC-OS. Further, the mixed film may have a stacked structure including a region of an amorphous oxide semiconductor, a region of a microcrystalline oxide semiconductor, and a region of a CAAC-OS, for example.

Note that an oxide semiconductor film may be in a single-crystal state, for example.

An oxide semiconductor film preferably includes a plurality of crystal parts. In each of the crystal parts, a c-axis is preferably aligned in a direction parallel to a normal vector of a surface where the oxide semiconductor film is formed or a normal vector of a surface of the oxide semiconductor film. Note that, among crystal parts, the directions of the a-axis and the b-axis of one crystal part may be different from those of another crystal part. An example of such an oxide semiconductor film is a CAAC-OS film.

The CAAC-OS film is not absolutely amorphous. The CAAC-OS film, for example, includes an oxide semiconductor with a crystal-amorphous mixed phase structure where crystal parts and amorphous parts are intermingled. Note that in most cases, the crystal part fits inside a cube whose one side is less than 100 nm. In an image obtained with a transmission electron microscope (TEM), a boundary between an amorphous part and a crystal part and a boundary between crystal parts in the CAAC-OS film are not clearly detected. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, for example, a c-axis is aligned in a direction parallel to a normal vector of a surface where the CAAC-OS film is formed or a normal vector of a surface of the CAAC-OS film. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seem from the direction perpendicular to the c-axis. Note that, among crystal parts, the directions of the a-axis and the b-axis of one crystal part may be different from those of another crystal part. In this specification, a term "perpendicular" includes a range from 80° to 100°, preferably from 85° to 95°. In addition, a term "parallel" includes a range from −10° to 10°, preferably from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that the film deposition is accompanied with the formation of the crystal parts or followed by the formation of the crystal parts through crystallization treatment such as heat treatment. Hence, the c-axes of the crystal parts are aligned in the direction parallel to a normal vector of the surface where the CAAC-OS film is formed or a normal vector of the surface of the CAAC-OS film.

In a transistor using the CAAC-OS film, change in electric characteristics due to irradiation with visible light or ultraviolet light is small. Thus, the transistor has high reliability.

Specific examples of the oxide semiconductor material in which holes have a larger effective mass than electrons include IGZO in which holes have an effective mass (mh*/me (me is the rest mass of a bare electron)) of about 10 or more and electrons have an effective mass (me*/me) of about 0.25, $In_2O_3$ in which holes have an effective mass of about 2 to 3 and electrons have an effective mass of about 0.2, indium gallium oxide (also referred to as IGO) in which holes have an effective mass of about 2.3, and the like. In addition, indium oxide in which some of indium atoms (typically 0 atomic % to 10 atomic %) are replaced with atoms of a metal M (M is Sn, Ti, Zr, Hf, or Ge), one example of which is represented by $In_{1.875}M_{0.125}O_3$, can be used as the oxide semiconductor material in which holes have a larger effective mass than electrons. Furthermore, a material obtained by replacing Ga in IGZO (In:Ga:Zn=1:1:1) with the metal M (M is Sn, Ti, Zr, Hf, or Ge) can be used as the oxide semiconductor material in which holes have a larger effective mass than electrons. Note that the above values of effective masses are estimated by first-principles calculations.

Note that the effective mass of a hole refers to the effective mass of a hole at the top of the valence band, i.e., in the vicinity of the point of maximum energy. The effective mass of a hole can be obtained using the curvature at the point of maximum energy of the valence band.

In this specification, the oxide semiconductor material in which holes have a larger effective mass than electrons does not include the case where holes are degenerate and there exist both heavy holes and light holes. The term "degenerate" means that there is a plurality of bands with the same or substantially the same energy at the point of maximum energy of the valence band. The individual effective masses of the plurality of degenerate bands can be obtained; the existence of a small effective mass means the existence of light holes. A light hole typically refers to a hole with an effective mass of 0.5 or less.

In this specification, the oxide semiconductor material in which holes have a larger effective mass than electrons includes the case where there exist light holes and heavy holes along a certain direction due to anisotropy. It is important that holes along the direction of the flow of off-state current have a large effective mass, in order to obtain a semiconductor device with significantly low off-state current. Accordingly, it is not necessarily required that holes along all directions have a large effective mass.

Meanwhile, in silicon, light holes have an effective mass of 0.16 and heavy holes have an effective mass of 0.52. In addition, in silicon, electrons along the longitudinal axis direction have an effective mass of 0.92 and electrons along the transverse axis direction have an effective mass of 0.19.

In GaN, light holes have an effective mass of 0.3 and heavy holes have an effective mass of 2.2.

Therefore, the oxide semiconductor material in which holes have a larger effective mass than electrons is greatly different from silicon and GaN. Because of the existence of light holes, the off-state current of a transistor formed using silicon or GaN is not as low as the off-state current of a transistor formed using the oxide semiconductor material in which there exist only heavy holes having an effective mass of 1 or more.

A transistor with significantly low off-state current can be obtained, and power consumption of an electronic device including the transistor can be reduced.

S BRIEF DESCRIPTION OF THE DRAWINGS

DETAILED DESCRIPTION OF THE INVENTION

Embodiments of the present invention will be described in detail below with reference to drawings. Note that the present invention is not limited to the description below, and it is easily understood by those skilled in the art that modes and details of the present invention can be modified in various ways. In addition, the present invention should not be construed as being limited to the description in the embodiments given below.

(Embodiment 1)

Figure 1A:
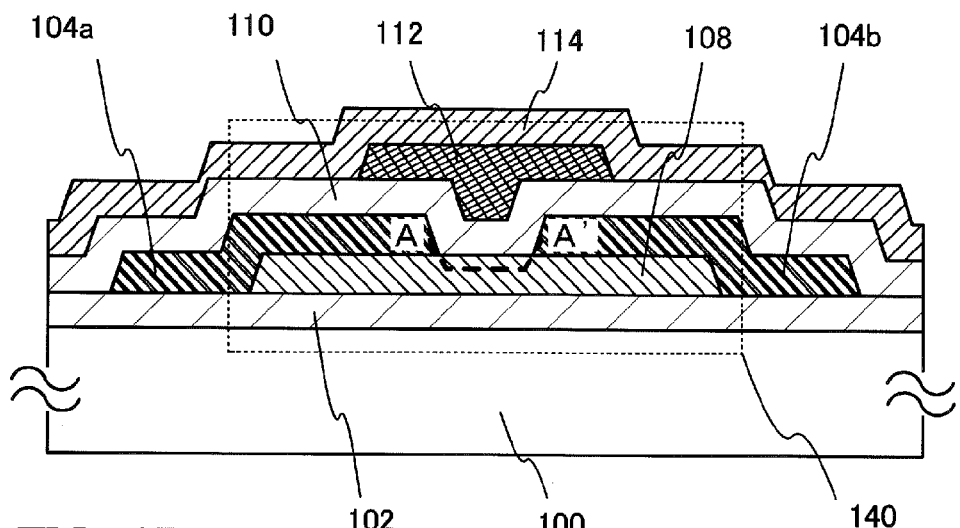
FIG. 1A is a cross-sectional view of a transistor and FIG. 1B is a band diagram corresponding to the transistor.

A semiconductor device and a method for manufacturing the semiconductor device will be described with reference to FIG. 1A. FIG. 1A is an example of a cross-sectional view of a transistor 140.

The transistor 140 in FIG. 1A includes, over a substrate 100, an insulating film 102, an oxide semiconductor film 108, a source electrode layer 104a, a drain electrode layer 104b, a gate insulating film 110, and a gate electrode 112. The transistor 140 is covered with an insulating film 114.

First, the insulating film 102 is formed over the substrate 100.

There is no particular limitation on a material of the substrate 100 as long as the material has heat resistance high enough to withstand at least heat treatment performed later. For example, a glass substrate, a ceramic substrate, a quartz substrate, a sapphire substrate, or the like can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. When a transistor is provided over the flexible substrate, the transistor may be formed directly over the flexible substrate, or the transistor may be formed over a different substrate and then separated to be transferred to the flexible substrate. In order to separate the transistor to transfer it to the flexible substrate, a separation layer is preferably formed between the different substrate and the transistor.

The insulating film 102 serves as a base. Specifically, the insulating film 102 may be formed using silicon oxide, silicon nitride, aluminum oxide, aluminum nitride, gallium oxide, a mixed material thereof, or the like. The insulating film 102 may be formed with a single-layer structure or a stacked-layer structure using an insulating film including any of the above materials.

There is no particular limitation on the method for forming the insulating film 102. For example, the insulating film 102 can be formed by a deposition method such as a plasma CVD method or a sputtering method. Note that a sputtering method is appropriate in terms of low possibility of entry of hydrogen, water, and the like. In this embodiment, a 300 nm thick silicon oxide film formed by a sputtering method is used.

Next, an oxide semiconductor film is formed over the insulating film 102 and is processed, so that the oxide semiconductor film 108 having an island shape is formed.

It is preferable to form the oxide semiconductor film by a method by which hydrogen, water, or the like does not easily enter the oxide semiconductor film. For example, a sputtering method or the like can be used. The thickness of the oxide semiconductor film is desirably larger than or equal to 3 nm and smaller than or equal to 40 nm. This is because the transistor might possibly be normally on when the oxide semiconductor film is too thick (e.g., the thickness is 50 nm or more).

As a material of the oxide semiconductor film, an oxide semiconductor material in which holes have a larger effective mass than electrons, such as an oxide semiconductor material containing indium or an oxide semiconductor material containing indium and gallium, may be used.

Examples of materials of the oxide semiconductor film include a four-component metal oxide such as In—Sn—Ga—Zn—O-based material, a three-component metal oxide such as an In—Ga—Zn—O-based material or an In—Sn—Zn—O-based material, a two-component metal oxide such as an In—Zn—O-based material, an In—Mg—O-based material, an In—Sn—O-based material, an In—Hf—O-based material, an In—Ti—O-based material, an In—Zr—O-based material, or an In—Ga—O-based material, a one-component metal oxide such as an In—O-based material, and the like. Here, for example, an In—Ga—Zn—O-based material means an oxide containing indium (In), gallium (Ga), and zinc (Zn), and there is no particular limitation on the composition. An element other than In, Ga, and Zn may also be contained.

In this embodiment, the oxide semiconductor film is formed by a sputtering method using an In—Ga—Zn—O-based oxide target so as to be 30 nm thick. As the In—Ga—Zn—O-based oxide target, for example, an oxide target with a composition of $In_2O_3:Ga_2O_3:ZnO=1:1:2$ [molar ratio] is used. Note that it is not necessary to limit the material and the composition of the target to the above. For example, an oxide target of $In_2O_3:Ga_2O_3:ZnO=1:1:1$ [molar ratio] can also be used.

More specifically, for example, the oxide semiconductor film can be formed as follows.

First, the substrate 100 is placed in a deposition chamber kept under reduced pressure, and the substrate temperature is set to a temperature higher than or equal to 100° C. and lower than or equal to 600° C., preferably higher than or equal to 200° C. and lower than or equal to 400° C. This is because the concentration of an impurity contained in the oxide semiconductor film can be reduced when deposition is performed while the substrate 100 is being heated. This is also because damage due to sputtering can be reduced.

Then, a high-purity gas in which impurities containing hydrogen atoms, such as hydrogen and water, are sufficiently reduced is introduced into the deposition chamber while moisture remaining in the deposition chamber is being removed, and the oxide semiconductor film is formed over the substrate 100 with the use of the target. To remove moisture remaining in the deposition chamber, an entrapment vacuum pump such as a cryopump, an ion pump, or a titanium sublimation pump is desirably used as an evacuation unit. The evacuation unit may be a turbo molecular pump provided with a cold trap. In the deposition chamber which is evacuated with the cryopump, a hydrogen molecule, a compound containing a hydrogen atom, such as water ($H_2O$), (more preferably, also a compound containing a carbon atom), and the like are reduced, whereby the concentration of an impurity in the oxide semiconductor film formed in the deposition chamber can be reduced.

An example of the deposition condition is as follows: the distance between the substrate and the target is 100 mm, the pressure is 0.6 Pa, the direct-current (DC) power is 0.5 kW, and the deposition atmosphere is an oxygen atmosphere (the proportion of oxygen flow is 100%).

Then, heat treatment is performed on the oxide semiconductor film, whereby the oxide semiconductor film is highly purified. With this heat treatment, hydrogen (including water and a hydroxyl group) can be removed from the oxide semiconductor film, the structure of the oxide semiconductor film can be ordered, and defect states in an energy gap can be reduced. The heat treatment is performed at a temperature higher than or equal to 250° C. and lower than or equal to 650° C., preferably higher than or equal to 450° C. and lower than or equal to 600° C., or lower than the strain point of the substrate. A transistor with extremely excellent characteristics can be obtained with the use of the oxide semiconductor film which is an i-type (intrinsic) or substantially i-type oxide semiconductor film supplied with oxygen from the insulating film 102 by the heat treatment.

The oxide semiconductor film can be processed by being etched after a mask having a desired shape is formed over the oxide semiconductor film. The mask can be formed by a method such as photolithography or an ink-jet method.

Note that the etching of the oxide semiconductor film may be dry etching or wet etching. It is needless to say that both of them may be employed in combination.

Next, a conductive film used to form the source electrode layer 104a and the drain electrode layer 104b (including a wiring formed using the same film as the source electrode layer 104a and the drain electrode layer 104b) is formed over the oxide semiconductor film 108 and then processed, so that the source electrode layer 104a and the drain electrode layer 104b are formed. In this embodiment, a 100 nm thick tungsten film is used as the conductive film used to form the source electrode layer and the drain electrode layer. Note that the channel length L of the transistor 140 is determined by the distance between the edges of the source electrode layer 104a and the drain electrode layer 104b which are formed here.

Next, the gate insulating film 110 is formed in contact with the oxide semiconductor film 108 so as to cover the source electrode layer 104a and the drain electrode layer 104b.

The gate insulating film 110 can be formed in a manner similar to that of the insulating film 102. That is, the gate insulating film 110 may be formed using silicon oxide, silicon nitride, aluminum oxide, aluminum nitride, gallium oxide, a mixed material thereof, or the like. Considering that the gate insulating film 110 functions as a gate insulating film of a transistor, a material having a high dielectric constant such as hafnium oxide, tantalum oxide, yttrium oxide, hafnium silicate ($HfSi_xO_y$, (x>0, y>0)), hafnium silicate to which nitrogen is added, or hafnium aluminate ($HfAl_xO_y$, (x>0, y>0)) to which nitrogen is added may be employed. In this embodiment, a 100 nm thick silicon oxide film formed by a sputtering method is used.

Then, the gate electrode 112 is formed. The gate electrode 112 can be formed using a metal material such as molybdenum, titanium, tantalum, tungsten, aluminum, copper, neodymium, or scandium or an alloy material which contains any of these materials as its main component. Note that the gate electrode 112 may have a single-layer structure or a stacked-layer structure. In this embodiment, the gate electrode 112 has a stacked-layer structure in which a tungsten film with a thickness of 135 nm is stacked over a tantalum nitride film with a thickness of 15 nm.

Through the above-described process, the transistor 140 is formed.

In addition, after the gate electrode 112 is formed, the insulating film 114 is formed so as to cover the transistor 140. For example, the insulating film 114 can be formed using silicon oxide, silicon nitride, aluminum oxide, aluminum nitride, gallium oxide, a mixed material thereof, or the like. In this embodiment, a 300 nm thick silicon oxide film formed by a sputtering method is used as the insulating film 114.

In view of the structure, materials, and electrical characteristics of the transistor 140 obtained as described above, theoretical consideration will be given below.

Table 1 shows physical properties of the oxide semiconductor film 108 including a channel formation region, i.e., IGZO, and tungsten contained in the source electrode layer and the drain electrode layer, along with measurement methods.

TABLE 1

| Physical properties | Measured value | Measurement method |
|---|---|---|
| Ionization potential of IGZO | 7.8 eV | UPS |
| Band gap of IGZO | 3.2 eV | ellipsometer |
| Work function of tungsten (W) | 5.0 eV | UPS |

IGZO has a large band gap of 3.2 eV. From these measured values, the electron affinity of IGZO can be calculated to be 4.6 eV, which is found to be close to 5.0 eV, i.e., the work function of tungsten used as a material of the source electrode layer and the drain electrode layer.

Figure 1B:
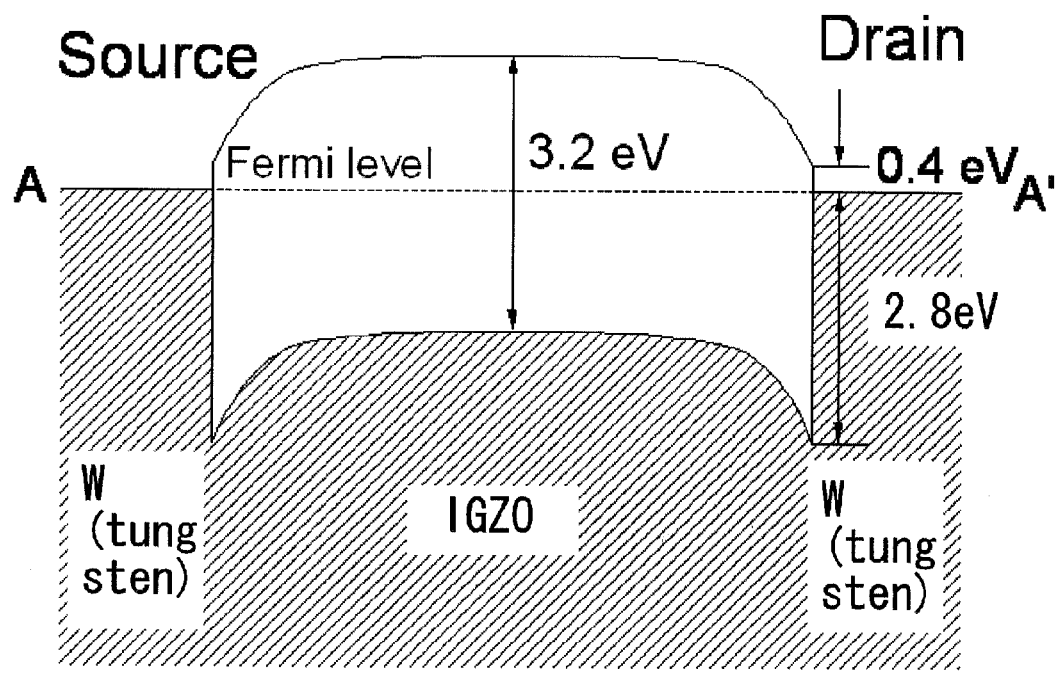

FIG. 1B is a band diagram of the transistor 140. Note that a dotted line A-A' in FIG. 1A corresponds to FIG. 1B.

For simplicity of explanation, it is assumed in the following description that IGZO is a perfect crystal without any defect states or impurity states. Then, there are three possible factors that contribute to off-state current: one is injection of thermally excited electrons from a source into a channel, another is injection of thermally excited holes from a drain into the channel, and the other is tunneling of holes from the drain to the channel.

Figure 2A:
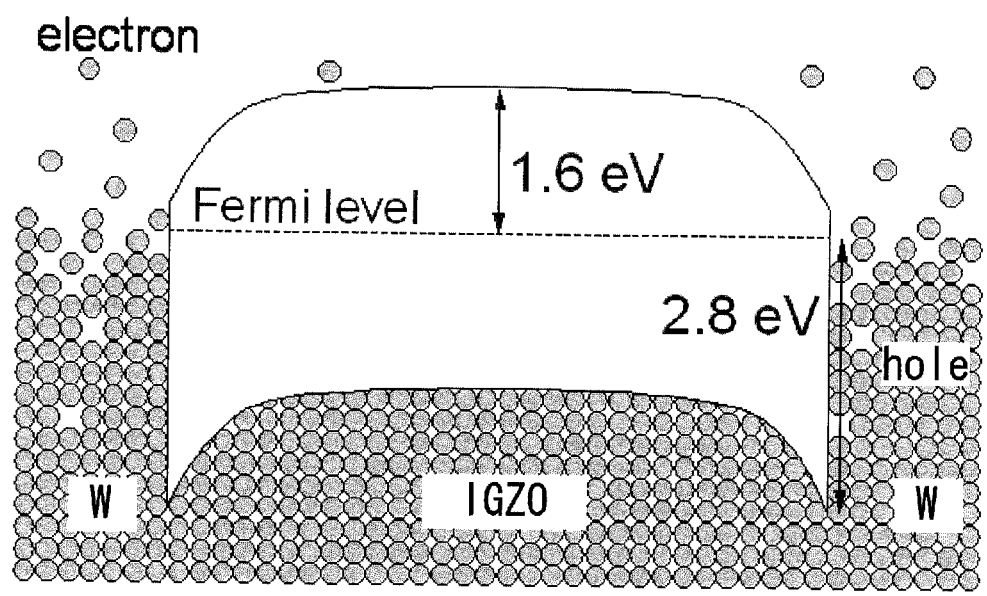
FIG. 2A is a conceptual band diagram and FIG. 2B is a conceptual band diagram at Vg<0 V.

For example, the energy barrier for electrons is half the band gap, i.e., 1.6 eV. FIG. 2A is a conceptual band diagram. Only one in $10^{27}$ electrons has an energy 1.6 eV higher than the Fermi energy. For example, assuming that the effective density of states in the conduction band is $10^{19}/cm^3$, the number of such electrons in the conduction band is only $10^{-8}/cm^3$. This is because the large band gap is dominant.

Note that as illustrated in FIG. 2A, only one in $10^{47}$ holes has an energy 2.8 eV higher than the Fermi energy. For example, assuming that the effective density of states in the valence band is $10^{19}/cm^3$, the number of such holes in the valence band is only $10^{-28}/cm^3$. This is because the high ionization potential is dominant.

Figure 2B:
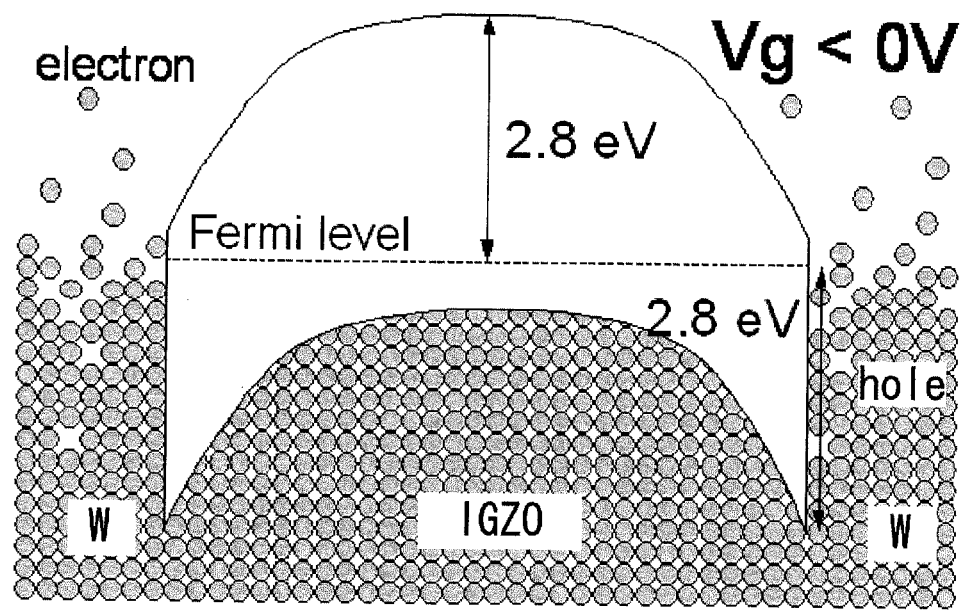
Figure 3:
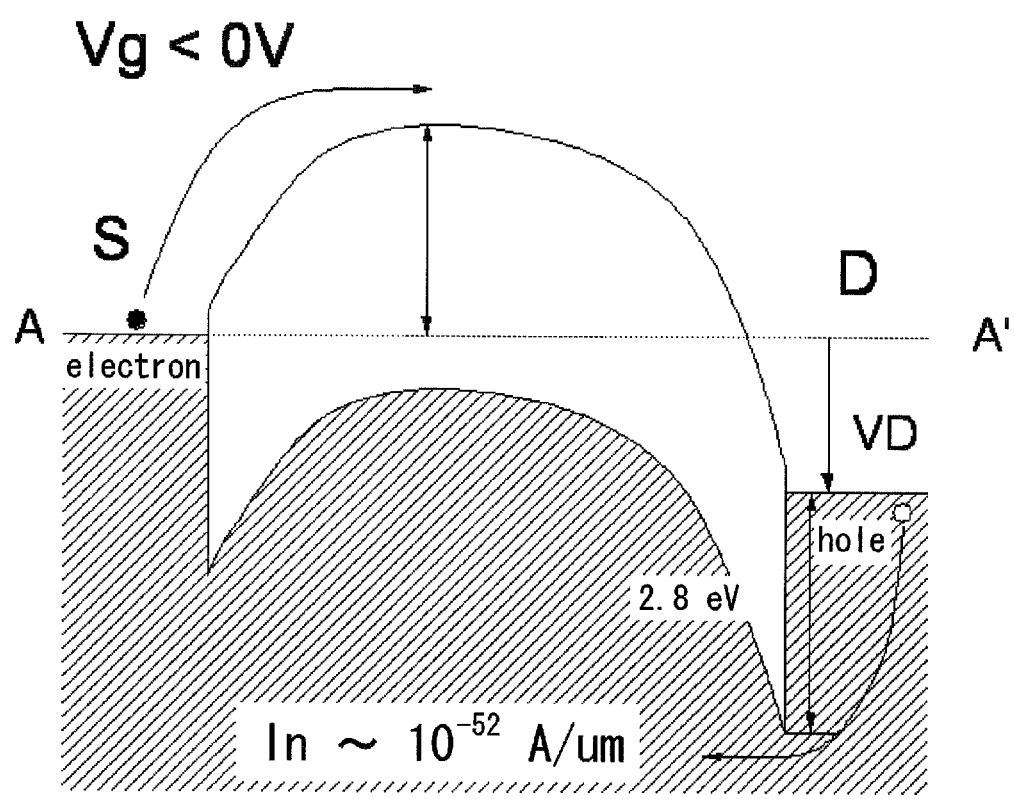
FIG. 3 is a conceptual band diagram at Vg<0 V and a drain voltage Vd>0 V.

FIG. 2B is a conceptual band diagram at Vg<0 V. Even when the channel formation region is n⁻, the energy barrier for electrons can be increased by application of Vg<0 V. For example, only one in $10^{47}$ electrons has an energy 2.8 eV higher than the Fermi energy. Assuming that the effective density of states in the conduction band is $10^{19}/cm^3$, the number of such electrons in the conduction band is only $10^{-28}/cm^3$. After all, the large band gap is dominant FIG. 3 is a schematic band diagram at Vg<0 V and a drain voltage Vd>0 V. By application of the drain voltage Vd>0 V, an electron or a hole with an energy higher than or equal to the energy barrier flows. The value of leakage current due to thermal excitation is much lower than 1 yA (yoctoampere).

These findings suggest that leakage due to thermal excitation of holes is significantly low owing to the high ionization potential and leakage due to thermal excitation of electrons can be sufficiently reduced by setting Vg lower than 0 V owing to the large band gap.

Here, a procedure for calculating leakage current due to thermal excitation is described.

In the case where the carrier density is lower than that in equilibrium, the probability of electron-hole pair generation, $R_{net}$, either by direct transition or by Shockley-Read-Hall indirect transition is expressed by the following formula 1.

$$R_{net} \propto \exp(-E_g/k_B T) \quad \text{[Formula 1]}$$

$E_g$ is the energy gap, $k_B$ is the Boltzmann constant, and T is the temperature.

At T=300 K, a transistor formed using IGZO (hereinafter referred to as an IGZO-FET) has a band gap of 3.2 eV and a transistor formed using silicon (hereinafter referred to as a Si-FET) has a band gap of 1.1 eV; thus, the ratio between the exponential factors in the formula 1 is estimated at $\exp(-(E_g(IGZO)-E_g(Si))/k_B T) \sim 10^{-35}$. This means that the probability of electron-hole pair generation in the IGZO-FET is 35 orders of magnitude lower than that in the Si-FET and is practically negligible.

This indicates that off-state current of the IGZO-FET due to thermal excitation is generated either by injection of a thermally excited electron from the source into the channel (a black dot in FIG. 3) or by injection of a thermally excited hole from the drain into the channel (a white dot in FIG. 3).

The leakage current generated by injection of a thermally excited electron from the source into the channel is expressed by the following formula 2 with the energy barrier $\Delta E_{ele}$ (=$E_C-E_F$) of the channel portion.

$$I \propto \exp(-\Delta E_{ele}/k_B T) \quad \text{[Formula 2]}$$

$E_C$ is the energy at the bottom of the conduction band and $E_F$ is the Fermi energy.

In a flat band state, it is estimated that the IGZO-FET has $\Delta E_{ele} \sim E_g/2$ (=1.6 eV) (assuming an intrinsic semiconductor) and the Si-FET has $\Delta E_{ele} \sim 0.6$ eV (a built-in potential at the p-n junction of Si). In this case, the ratio between the exponential factors in the formula 2 is $\exp(-(\Delta E_{ele}(IGZO)-\Delta E_{ele}(Si))/k_B T) \sim 10^{-17}$, and the exponential factor in injection of a thermally excited electron into the channel in the IGZO-FET is 17 orders of magnitude smaller than that in the Si-FET (T=300 K).

In addition, the injection of a thermally excited electron into the channel can be exponentially reduced by lowering the gate voltage. The change in the energy at the conduction band edge, $\Delta E_c$, with a shift of $\Delta V_g$ in the gate voltage is expressed by the following formula 3.

$$\Delta E_C \sim \ln 10 \, k_B T/q/S \Delta V_g \quad \text{[Formula 3]}$$

S is the S value (subthreshold swing) and q is the elementary charge. In one example of electrical characteristics of the IGZO-FET illustrated in FIG. 13, the S value is S=69 mV/decade, which is a favorable value. According to the formula 3, with a −1 V change in the gate potential, the exponential factor in the formula 2 can be sufficiently decreased to $\exp(-60/69/k_B T) \sim 10^{-15}$. In this manner, it can be seen that the leakage current due to injection of thermally excited electrons from the source into the channel is practically negligible when the gate voltage is controlled.

In addition, leakage current due to injection of a thermally excited hole from the drain into the channel is expressed by the following formula 4 with the energy barrier $\Delta E_{hole}$ of the junction portion.

$$I \propto \exp(-\Delta E_{hole}/k_B T) \quad \text{[Formula 4]}$$

The energy barrier $\Delta E_{hole}$ of the junction portion is represented by the difference between the ionization potential of IGZO and the work function of the drain electrode, and from Table 1, $\Delta E_{hole}$ is found to be 2.8 eV. In the Si-FET, the injection of holes from the drain into the channel is proportional to the minority carrier density in the drain region and is therefore substantially proportional to $\exp(-E_g(Si)/k_B T)$. The ratio between the exponential factors in the formula 4 is shown below.

$$\exp(-(\Delta E_{hole}(IGZO)-E_g(Si))/k_B T) \sim 10^{-27} \quad \text{[Formula 5]}$$

It can be seen that the exponential factor in injection of a thermally excited hole into the channel in the IGZO-FET is 27 orders of magnitude smaller than that in the Si-FET and is practically negligible (T=300 K).

Next, contribution of tunneling current is considered. As the tunneling current, drain-to-channel tunneling of holes is considered to contribute to the off-state current of the IGZO-FET.

Figure 4:
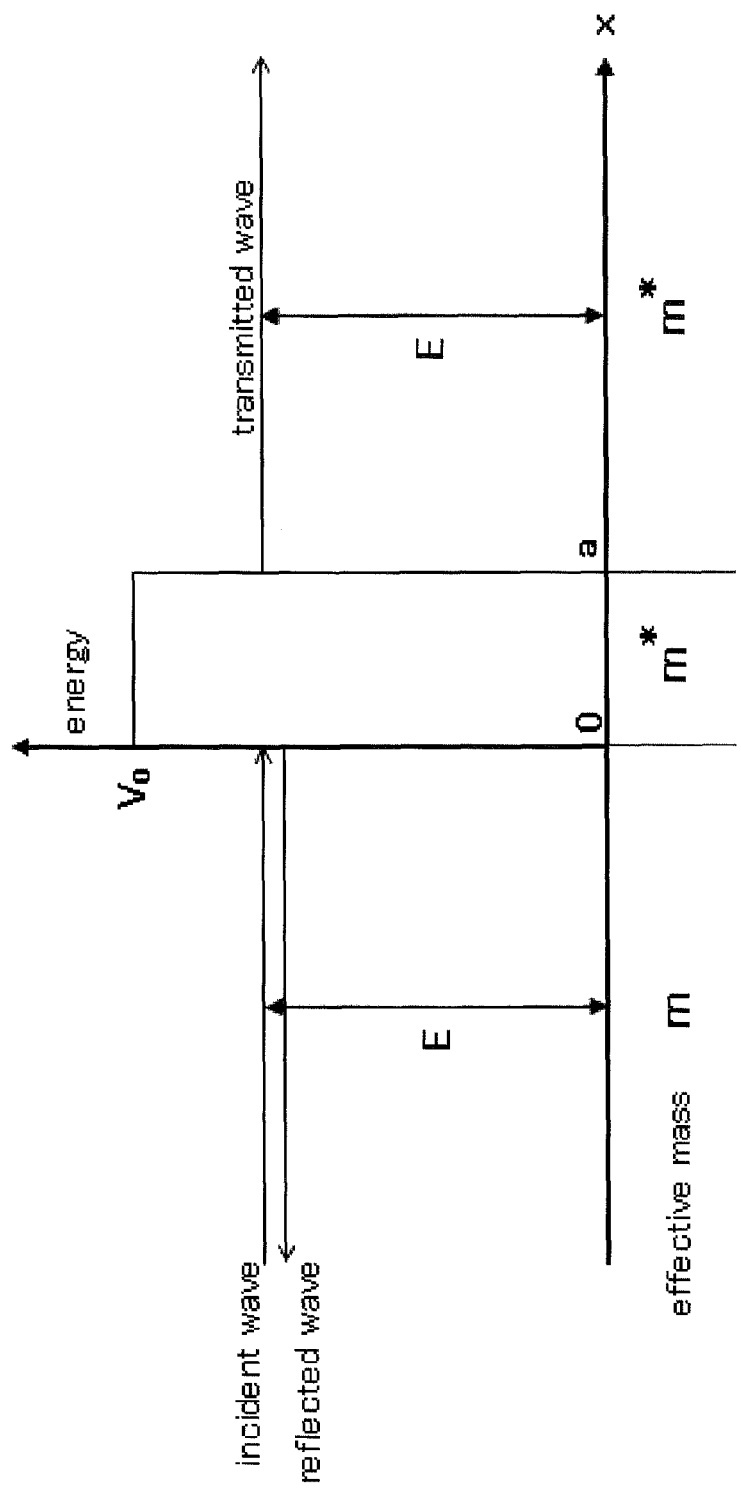
FIG. 4 illustrates a simplified condition of tunneling.

Thus, a simplified condition of this tunneling is considered, in which a particle passes through a rectangular potential barrier with width a and height $V_0$ as illustrated in FIG. 4.

It is assumed that m is the effective mass of the particle at x<0, and m* is the effective mass of the particle at x≥0. The probability that a particle having energy E ($0<E<V_0$) impinges on the barrier from a region with x<0 and tunnels through a region with 0≤x≤a in the barrier to a region with x>a can be given by the following formula 6 by solving the Schrödinger equation.

$$T = \left[1 + \frac{V_0\left(V_0 - \left(1 - \frac{1}{\gamma}\right)E\right)\sinh^2(ka\sqrt{\gamma})}{\left(1 + \frac{1}{\sqrt{\gamma}}\right)^2 E(V_0 - E)}\right]^{-1} \quad \text{[Formula 6]}$$

Here, k is represented by the following formula 7.

$$k = \frac{2\pi}{h}\sqrt{2m(V_0 - E)} \quad \text{[Formula 7]}$$

Note that h is the Planck's constant and $\gamma = m^*/m$ is the mass ratio. As $\sinh^2(ka\sqrt{\gamma})$ increases, the passage probability T decreases exponentially according to $\exp(-2\ ka\sqrt{\gamma})$.

In this case, the particle corresponds to a hole; the region with x<0 corresponds to a drain; and the region with x>0 corresponds to a channel. This means that m corresponds to the effective mass of a hole in tungsten (assumed here to correspond to the mass of a bare electron), and m* corresponds to the effective mass of a hole in IGZO.

Actually, an electric field is applied to the barrier, so the potential barrier is probably not rectangular but is close to a triangular shape, as illustrated in FIG. 3. Even in such a case, the exponential dependence of the passage probability T on $\sqrt{\gamma}$ does not change.

It can be seen from the formula 6 that the probability of passage by tunneling exponentially depends on the effective mass of a hole in IGZO. If $V_0-E \approx 1$ eV and a≈1 nm, it is estimated that $\exp(-2\ ka) \sim 10^{-5}$. As the mass ratio γ increases, the probability of hole tunneling decreases drastically. Therefore, the effective mass of holes in an IGZO crystal is obtained below. Specifically, an energy band structure is obtained by first-principles calculations based on the density-functional theory (DFT) to determine the effective mass of a hole at the valence band edge.

Figure 5:
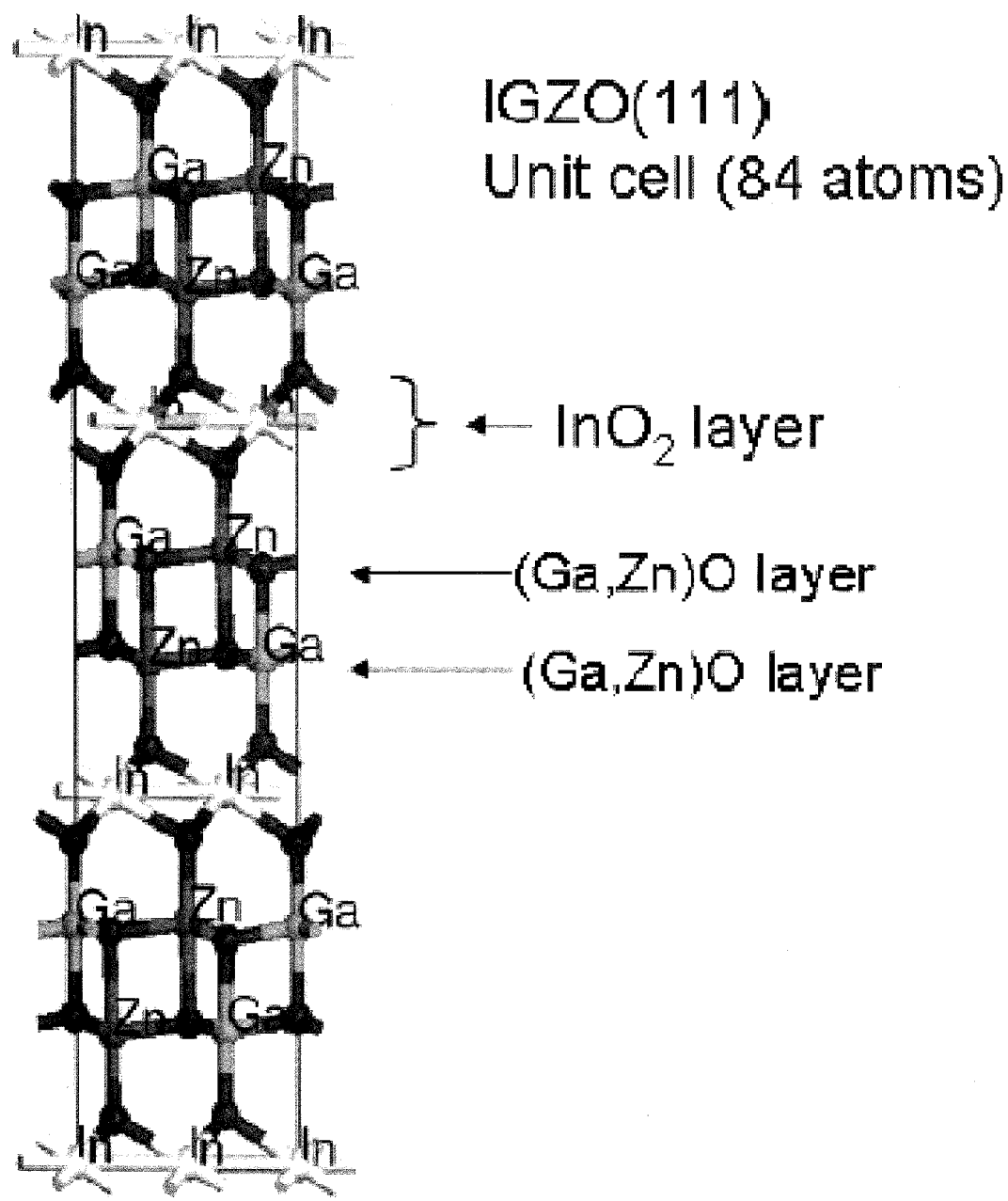
FIG. 5 illustrates a crystal structure of IGZO.

FIG. 5 shows a crystal structure of IGZO ($YbFe_2O_4$ structure).

As shown in FIG. 5, the unit cell has a structure in which three units are stacked in the c-axis direction, each unit including three layers that are a combination of one $InO_2$ layer and two layers each consisting of Ga, Zn, and O. The total number of atoms in the unit cell is 84.

The band structure is obtained using first-principles calculations, and from the structure of the valence band edge, the effective mass of a hole is obtained through the following procedure.

In the calculations, the norm-conserving pseudopotential DFT employed in OpenMX is used for the unit cell, and the Perdew-Burke-Ernzerhof (PBE) generalized gradient approximation (GGA) is used for the exchange interaction potential of electrons. The cut-off energy of the local basis function is set at 200 Ryd (≈2.7 keV), and the k-point sampling is conducted using a 5×5×3 mesh.

Figure 6A:
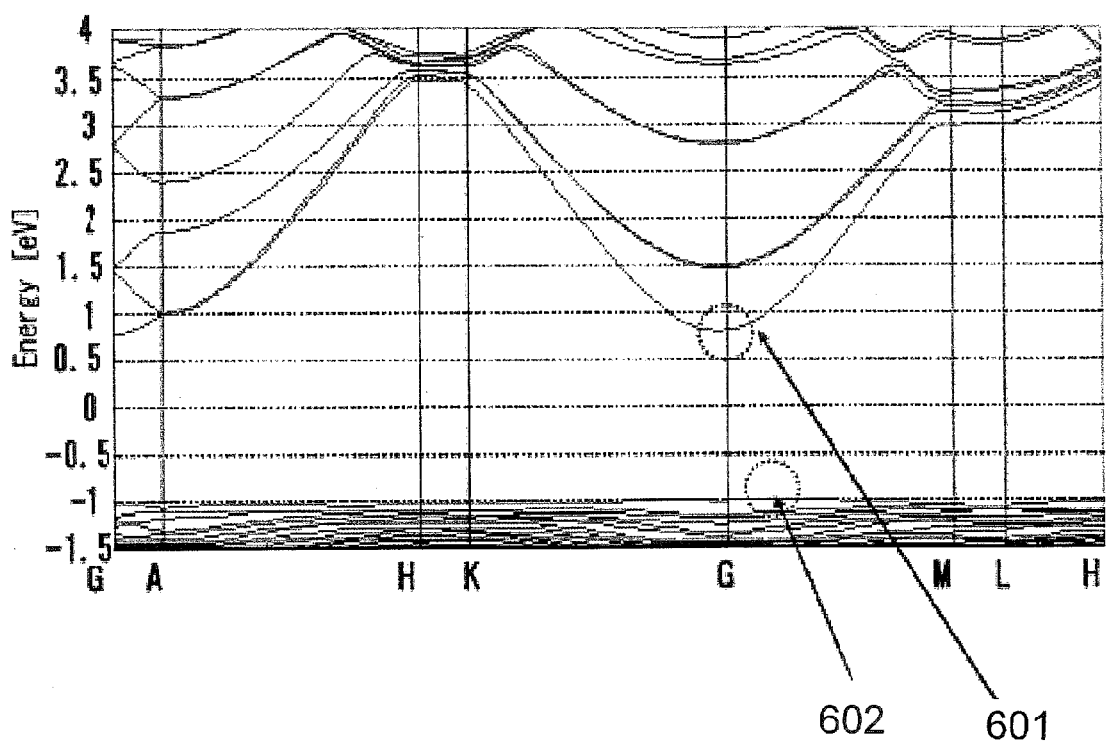
FIG. 6A is a band diagram of IGZO which is obtained by calculation and FIG. 6B illustrates a Brillouin zone of an IGZO structure.
Figure 6B:
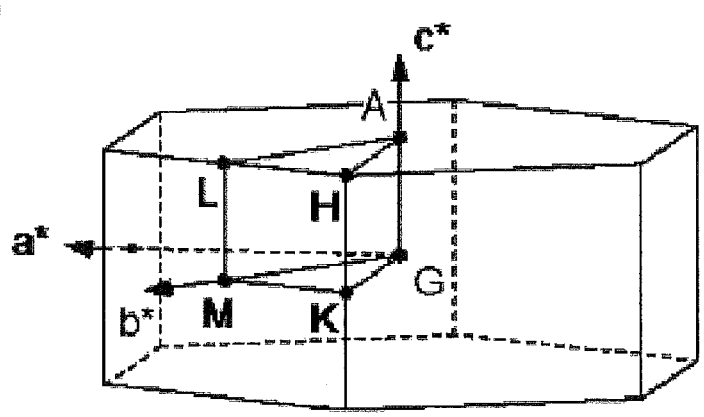

FIG. 6A shows a band diagram of IGZO which is obtained by calculation and FIG. 6B illustrates the Brillouin zone of an IGZO structure. In FIG. 6A, a conduction band edge 601 and a valence band edge 602 are indicated with dotted circles. It should be noted here that the distribution of the valence band is significantly flat compared with the distribution of the conduction band.

Figure 7A:
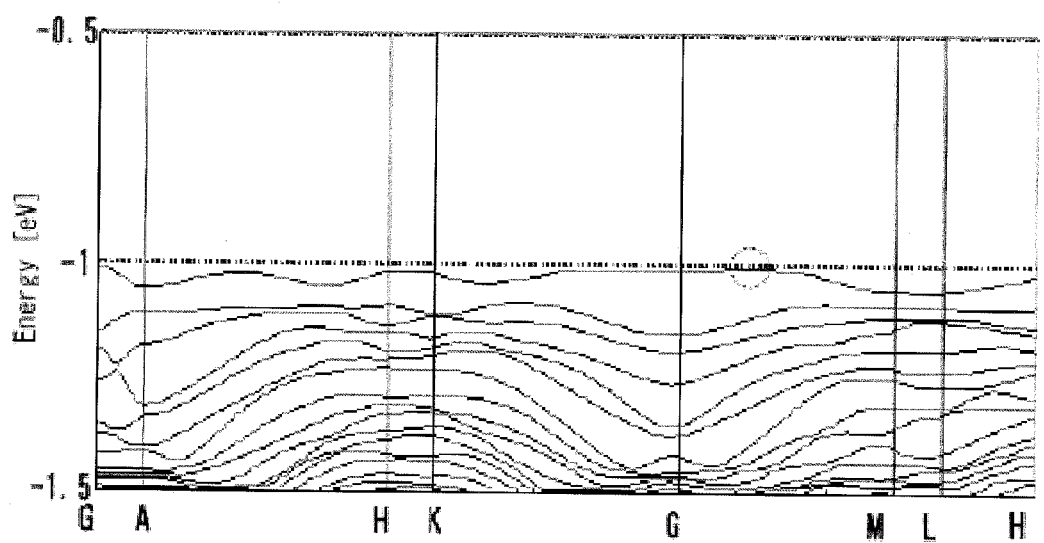
FIG. 7A illustrates a valence band edge of a band and FIG. 7B illustrates a Brillouin zone of an IGZO structure.
Figure 7B:
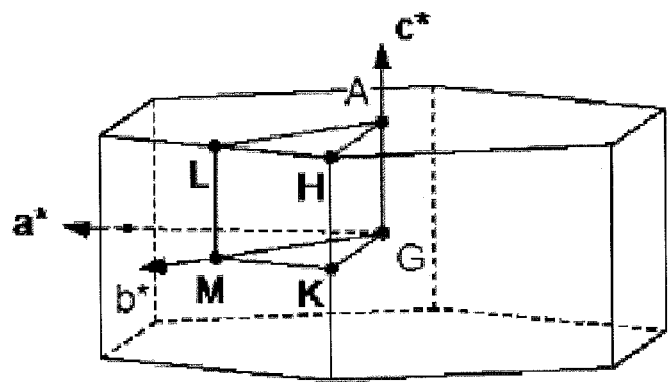

FIG. 7A is an enlarged view of the valence band in FIG. 6A. FIG. 7B illustrates the Brillouin zone of the IGZO structure.

Furthermore, the effective mass of a hole at the valence band edge is estimated by detailed calculation in k-space. Table 2 shows the effective mass of a hole at the valence band edge and the effective mass of an electron at the conduction band edge. For comparison, the effective mass of a hole in Si is also shown. Note that axes of real-space lattice vectors are denoted by an a-axis, a b-axis, and a c-axis, and the corresponding axes of reciprocal lattice vectors are denoted by an a*-axis, a b*-axis, and a c*-axis.

TABLE 2

| Material | Hole effective mass (m*/me) | Electron effective mass |
|---|---|---|
| IGZO(111) | 21 (a*-axis) | 0.25 (a*-axis) |
|  | 40 (b*-axis) | 0.25 (b*-axis) |
|  | 11 (c*-axis) | 0.23 (c*-axis) |
| Si | 0.52 (heavy) | 0.92 (longitudinal) |
|  | 0.16 (light) | 0.19 (transverse) |

The effective mass of a hole in Si is less than about 0.2 (light hole), whereas the effective mass of a hole in IGZO is about 10 or more and is significantly large. This is about 50 or more times the effective mass of a hole (light hole) or an electron in Si, and about 40 or more times the effective mass of an electron in IGZO (about 0.25).

The above results show that the leakage current of the IGZO-FET due to tunneling of holes is significantly low owing to heavy holes having an effective mass of 10 or more. In the case where heavy holes in IGZO have an effective mass of 10 and are compared with heavy holes in Si, if $V_0-E \approx 1$ eV and a 1 nm, the ratio between the exponential factors in the formula 5 is estimated at $\exp(-2\ ka(\sqrt{\gamma}(IGZO)-\sqrt{\gamma}(Si)))\ 10^{-13}$. Accordingly, the exponential factor for the probability of hole tunneling in the IGZO-FET is 13 orders of magnitude smaller than that in the Si-FET. Actually, the exponential factor is still smaller because the band gap of IGZO is larger than the band gap of Si.

Note that the results also show that the effective masses of holes in IGZO along the a-axis direction and the b-axis direction are each larger than the effective mass along the c-axis direction. This suggests that hole tunneling current which flows in the a-b plane is smaller than hole tunneling current which flows in the c-axis direction.

In IGZO, the effective mass of a hole is about 10 or more times the effective mass of a bare electron, which confirms that leakage current due to tunneling is low. In addition, IGZO has a large band gap of 3.2 eV and a high ionization potential of 7.8 eV, which confirms that leakage current due to thermal excitation is significantly low. The above theoretical consideration shows that the off-state current of an FET formed using IGZO in a channel can be significantly low.

IGZO in the above calculations corresponds to IGZO at In:Ga:Zn=1:1:1 and is referred to as IGZO(111). Other materials having the crystal structure of IGZO(111) with varying proportions of In and Ga are also calculated similarly. Specifically, IGZO at In:Ga:Zn=3:1:2 (hereinafter referred to as IGZO(312)), IGZO at In:Ga:Zn=4:0:2 (hereinafter referred to as IGZO(402)), and IGZO at In:Ga:Zn=0:4:2 (hereinafter referred to as IGZO(042)) are calculated. IGZO(402) is indium zinc oxide and IGZO(042) is gallium zinc oxide. Table 3 shows the results of these calculations.

TABLE 3

| Name of material | Position of top of valence band | Hole (mh*/me) | | |
|---|---|---|---|---|
| | | a* direction | b* direction | c* direction |
| IGZO(111) | | (−0.45, 0, 0.3) | 21 | 40 | 11 |
| IGZO(312) | | (−0.4, −0.15, 0.5) | 16 | 19 | 11 |
| IGZO(402) | L-point | (0, 0.5, 0.5) | 3 | 20 | 61 |
| IGZO(042) | G-point | (0, 0, 0) | 31 | 16 | 0.44 |

| Name of material | Position of bottom of conduction band | Electron (me*/me) | | |
|---|---|---|---|---|
| | | b* direction | (a* + b*) direction | c* direction |
| IGZO(111) | G-point | (0, 0, 0) | 0.25 | 0.25 | 0.23 |
| IGZO(312) | G-point | (0, 0, 0) | 0.21 | 0.21 | 0.20 |
| IGZO(402) | G-point | (0, 0, 0) | 0.21 | 0.21 | 0.20 |
| IGZO(042) | G-point | (0, 0, 0) | 0.24 | 0.24 | 0.25 |

Figure 14:
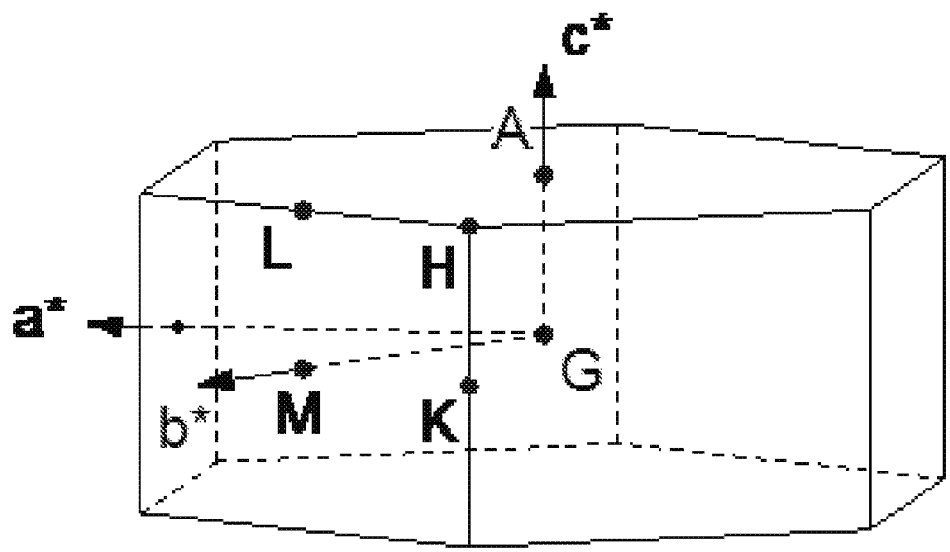
FIG. 14 illustrates a Brillouin zone.

FIG. 14 shows reciprocal lattice vectors and a Brillouin zone corresponding to the materials in Table 3.

As shown in Table 3, it can be confirmed that the effective mass of a hole in IGZO is large regardless of the proportions of In and Ga. Specifically, the effective mass of a hole in IGZO is 20 or more times the effective mass of a hole (light hole) or an electron in Si, and 20 or more times the effective mass of an electron (0.2 to 0.25) in IGZO. That is, it can be considered that the IGZO-FET has significantly low hole tunneling current regardless of the proportions of In and Ga. Note that only holes along the c*-axis direction in IGZO (042) have a small effective mass of 0.5 or less.

Figure 15:
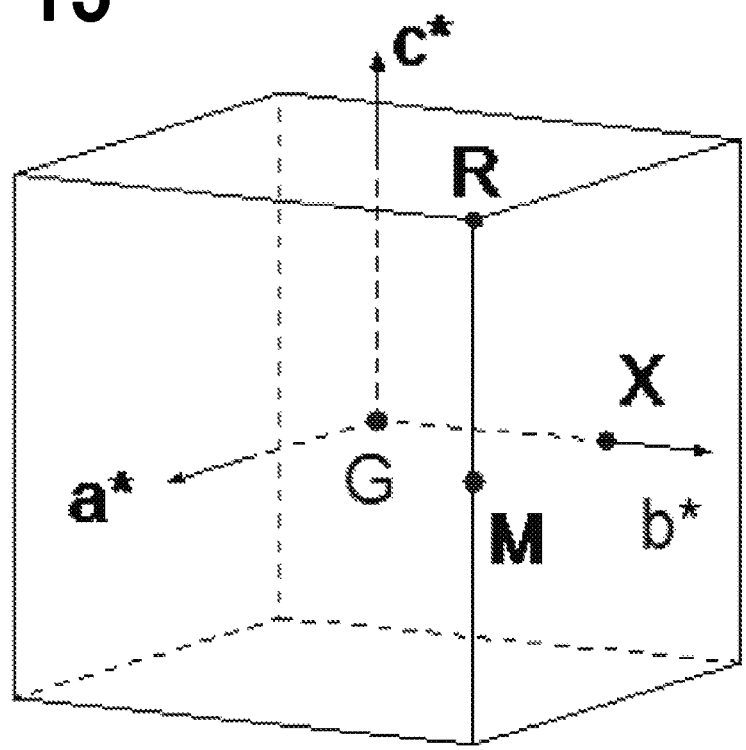
FIG. 15 illustrates a Brillouin zone.

For comparison, indium oxide and materials ($In_{1.875}M_{0.125}O_3$) each obtained by replacing some of In atoms (typically 0 atomic % to 10 atomic %) with atoms of a metal M (M is Sn, Ti, Zr, or Hf) are also calculated similarly. Note that a material obtained by replacing one in 16 In atoms with an atom of another element is represented by $In_{1.875}M_{0.125}O_3$. The bixbyite structure is employed as the crystal structure. Specifically, the effective mass of a hole is estimated using a method similar to that in the above calculations of IGZO. Note that k-point sampling is conducted using a 5×5×5 mesh. Table 4 shows the calculated effective masses. Note that FIG. 15 shows reciprocal lattice vectors and a Brillouin zone corresponding to the materials in Table 4.

TABLE 4

| Name of material | Position of top of valence band | | Hole (mh*/me) | | |
|---|---|---|---|---|---|
| | | | a* direction | b* direction | c* direction |
| In2O3 | on GM | (0.35, 0, 0, 35) | 2.5 | 3.4 | 2.1 |
| In1.875Sn0.125O3 (b) | on GM | (0.35, 0, 0.35) | 2.1 | 2.0 | 3.9 |
| In1.875Sn0.125O3 (d) | on GX | (0.3, 0, 0) | 1.5 | 10 | 7.7 |
| In1.875Hf0.125O3 (d) | on GX | (0.3, 0, 0) | 1.4 | 7.3 | 7.9 |
| In1.875Ti0.125O3 (d) | M-point | (0, 0.5, 0.5) | 1.5 | 10 | 7.4 |
| In1.875Zr0.125O3 (d) | M-point | (0, 0.5, 0.5) | 4.8 | 2.4 | 2.1 |

| Name of material | Position of bottom of conduction band | | Electron (me*/me) | | |
|---|---|---|---|---|---|
| | | | (a* + b*) direction | b* direction | (a* + b* + c*) direction |
| In2O3 | G-point | (0, 0, 0) | 0.20 | 0.20 | 0.20 |
| In1.875Sn0.125O3 (b) | G-point | (0, 0, 0) | | | |
| In1.875Sn0.125O3 (d) | G-point | (0, 0, 0) | 0.19 | 0.19 | 0.19 |
| In1.875Hf0.125O3 (d) | G-point | (0, 0, 0) | | | |
| In1.875Ti0.125O3 (d) | G-point | (0, 0, 0) | 0.24 | 0.24 | 0.23 |
| In1.875Zr0.125O3 (d) | G-point | (0, 0, 0) | 0.23 | 0.23 | 0.23 |

Note that the suffixes "(b)" and "(d)" added to the end of the names of materials in Table 4 indicate the sites of replaced indium atoms. In indium oxide having the bixbyite structure, there are two kinds of indium sites with different symmetries. The sites are indicated by "b" and "d" in the Wyckoff notation, according to which the suffix "(b)" is added to a material where indium atoms at b-sites are replaced and the suffix "(d)" is added to a material where indium at d-sites are replaced.

As shown in Table 4, holes in indium oxide ($In_2O_3$) have a large effective mass of about 2 to 3 along each of the a*-axis, b*-axis, and c*-axis directions. This is 10 or more times the effective mass of a hole (light hole) or an electron in Si, and holes in $In_2O_3$ can be considered to be heavy holes. In addition, this is 10 or more times the effective mass of an electron in $In_2O_3$. Accordingly, it can be considered that tunneling current is significantly low in the case of these materials.

In the materials each obtained by replacing one in 16 In atoms with an atom of another element, the effective mass of holes differs depending on the axis. Holes have a small effective mass of about 1.4 to 2.1 along one axis and a large effective mass of about 4 or more along another axis. Even the small effective mass of a hole along the one axis is 5 or more times, or 10 or more times, the effective mass of a hole or an electron in Si. In addition, the effective mass is 5 or more times, or 10 or more times, the effective mass of an electron in the materials each obtained by replacing one in 16 In atoms with an atom of another element. Accordingly, it can be considered that tunneling current is significantly low in the case of these materials.

For comparison, materials each obtained by replacing Ga in IGZO (In:Ga:Zn=1:1:1) with a metal M (M is Ti, Zr, or Hf) are also calculated similarly. The $YbFe_2O_4$ structure is employed as the crystal structure. Specifically, the effective mass of a hole is estimated using a method similar to that in the above calculations of IGZO. Note that k-point sampling is conducted using a 5×5×3 mesh. Table 5 shows the calculated effective masses.

TABLE 5

| Name of material | Position of top of valence band | | Hole (mh*/me) | | |
|---|---|---|---|---|---|
| | | | a* direction | b* direction | c* direction |
| IZrZO(111) | G-point | (0, 0, 0) | 3.3 | 3.5 | 0.4 |
| ITiZO(111) | G-point | (0, 0, 0) | 4.8 | 6.7 | 0.5 |
| IHfZO(111) | | (0.15, 0.9, 0) | 7.9 | 3.5 | 2.0 |

| Name of material | Position of bottom of conduction band | | Electron (me*/me) | | |
|---|---|---|---|---|---|
| | | | a* direction | b* direction | c* direction |
| IZrZO(111) | G-point | (0, 0, 0) | 0.37 | 0.37 | 0.32 |
| ITiZO(111) | G-point | (0, 0, 0) | 0.41 | 0.41 | 0.36 |
| IHfZO(111) | G-point | (0, 0, 0) | 0.37 | 0.40 | 0.38 |

As shown in Table 5, holes in ITiZO (In:Ti:Zn=1:1:1) and IZrZO (In:Zr:Zn=1:1:1) each have an effective mass of about 3 to 7 along each of the a*-axis and b*-axis directions and have an effective mass of about 0.4 to 0.5 along the c*-axis direction. The effective mass along each of the a*-axis and b*-axis directions is 10 or more times the effective mass of a hole or an electron in Si, and the holes are heavy holes. In addition, it is about 10 times the effective mass of an electron in the same material. Holes in IHfZO (In:Hf:Zn=1:1:1) have an effective mass of 2 to 8, which is 10 or more times the effective mass of a hole or an electron in Si, and the holes are heavy holes. In addition, it is about 10 times (about 5 or more times along the c*-axis direction) the effective mass of an electron in the same material. Accordingly, it can be considered that tunneling current is significantly low in the case of these materials.

For comparison, IGO (InGaO$_3$), SiC, and GaN are also calculated similarly. Specifically, the effective masses of holes are estimated using a method similar to that in the above calculations of IGZO. Note that k-point sampling is conducted using a 5×5×3 mesh. Table 6 shows the calculated effective masses, along with crystal structures, ionization potentials, band gaps, and electron affinities of the materials. Note that the values of In$_2$O$_3$ are shown again.

TABLE 6

| Material | Structure | Hole effective mass (m*/me) | Electron effective mass (me*/me) | Ionization potential (eV) | Band gap (eV) | Electron affinity (eV) |
|---|---|---|---|---|---|---|
| In2O3 | bixbyite | 2.1 to 3.4 | 0.2 | 7.2 | 3 | 4.2 *1 |
| IGO | (hexiagonal) | about 2.3 | 0.2 to 0.25 | 7.9 | 3.3 | 4.6 *1 |
| (2H)—SiC | Wurtzite | about 2 (heavy) about 0.4 (light) | 0.28 to 0.5 | 7.4 *1 | 3.3 | 4.1 |
| GaN | Wurtzite | about 2.2 (heavy) about 0.3 (light) | 0.2 to 0.26 | 7.6 *1 | 3.5 | 4.1 |

*1 (ion energetics) = Eg + χ

In SiC and GaN shown in Table 6, heavy holes have an effective mass of about 2 and light holes have an effective mass of 0.5 or less. It can be considered that tunneling of light holes is dominant in these materials, which greatly differ from IGZO. The band gap and electron affinity of each of these materials are comparable to those of IGZO. However, in the case where an FET is fabricated using either of these materials, leakage current due to tunneling may be increased and off-state current may also be increased compared with those of the IGZO-FET.

In IGO and In$_2$O$_3$ shown in Table 6, holes have an effective mass of about 2 to 3, which is much larger than the effective mass of a hole (light hole) in SiC or GaN and is 10 or more times the effective mass of a hole or an electron in Si. In addition, it is about 10 or more times the effective mass of an electron in the same material.

In addition, the band gap and electron affinity of each of these materials are comparable to those of IGZO, which suggests that the contribution of leakage current due to thermal excitation is small. Accordingly, it can be considered that in the case where an FET is fabricated using either of these materials, leakage current due to tunneling is significantly low and off-state current is also significantly low.

Note that leakage current flows differently depending on the structure of a source region and a drain region; a comparison can be made for the following reason. For example, an n-type Si-FET has a source region and a drain region including n$^+$Si, and an IGZO-FET has a source region and a drain region which are directly connected to IGZO that is an intrinsic semiconductor. As a result, leakage current of the Si-FET due to thermal excitation is diffusion current of holes that are minority carriers in the source region and the drain region, and leakage current of the IGZO-FET due to thermal excitation is generated by injection of holes over an energy barrier formed at a connection portion between a metal and IGZO. In addition, tunneling current of the Si-FET is band-to-band tunneling current, and tunneling current of the IGZO-FET is tunneling current across the energy barrier formed at the connection portion between the metal and IGZO. However, the exponential factor for leakage current of the IGZO-FET is the same as that of the Si-FET, and a discussion of such a comparison between the IGZO-FET and the Si-FET as described above is possible.

The energy barrier for leakage current due to thermally excited holes can be regarded as being equal to the difference between the ionization potential of a material used in a channel portion and the work function of a material of a source electrode and a drain electrode. A metal typically has a work function of about 5 eV or lower. An energy barrier of 1 eV, preferably 2 eV or higher, would be sufficient to suppress leakage current. Therefore, the ionization potential of the material used in the channel portion is preferably greater than or equal to 6 eV, further preferably greater than or equal to 7 eV.

In the case where the effective mass of the band-to-band tunneling current in Si is about 0.2, even if the tunneling width and the energy barrier are the same, the tunneling current in IGZO is equal to or less than the tunneling current in Si raised to the power of √5, i.e., the power of 2, and is significantly low when the effective mass of a hole is 5 or more times the effective mass of a hole or an electron in Si, i.e., the effective mass is 1 or more. It is further preferable that the effective mass of a hole be 10 or more times the effective mass of a hole or an electron in Si, i.e., the effective mass be 2 or more, in which case the tunneling current in IGZO is equal to or less than the tunneling current in Si raised to the power of √10, i.e., the power of 3, and is significantly low.

In the case where band-to-band tunneling is important as in the Si-FET or a GaN-FET, both electrons and holes are considered to contribute to tunneling current. In the case where electrons and holes have the same effective mass, they equally contribute to current; in the case where holes have a larger effective mass than electrons, holes contribute less to current and electrons still contribute to tunneling current. In such a case, the ratio between the effective mass of an electron and the effective mass of a hole in the same material is also important. The effective mass of an electron is preferably small for the mobility or on-state current of a transistor. The effective mass of a hole is preferably large in order to suppress tunneling current. A sufficiently small contribution of holes to tunneling current compared with the contribution of electrons is effective. Typically, holes whose effective mass is 5 times, preferably 10 times, further preferably 20 times, the effective mass of electrons are effective in reducing tunneling current.

When the band gap is smaller than 2 eV, the energy barrier for electrons or holes is smaller than 2 eV, which implies that leakage current due to heat is not significantly low. On the other hand, when the band gap is larger than 4 eV, a Schottky junction is formed with the source electrode or the drain electrode, which implies that it is likely that sufficient on-state current of a transistor cannot be obtained. Therefore, it is preferable that the band gap be larger than or equal to 2 eV and smaller than or equal to 4 eV.

When a flat band potential is applied to the gate electrode, the carrier density in the channel formation region is preferably greater than or equal to $10^{-16}/cm^3$ and less than $10^{17}/cm^3$, further preferably less than $10^{16}/cm^3$. With a carrier density of $10^{17}/cm^3$ or more, it is difficult to properly turn off the transistor even when a negative potential is applied to the gate electrode. In other words, it is difficult to sufficiently reduce off-state current.

(Embodiment 2)

In this embodiment, as an example of a semiconductor device, a storage medium (memory element) will be described. In this embodiment, the transistor including an oxide semiconductor described in Embodiment 1 and a transistor including a material other than an oxide semiconductor are formed over one substrate.

Figure 8A:
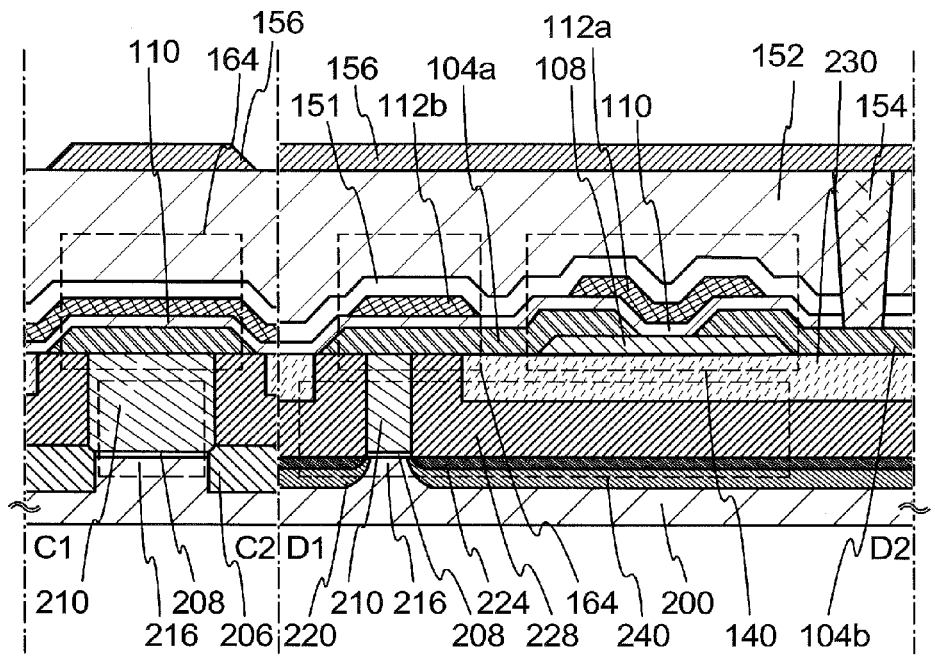
FIGS. 8A to 8C illustrate an embodiment of a semiconductor device.
Figure 8B:
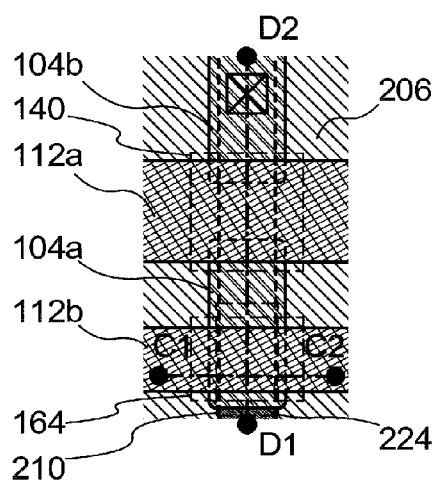
Figure 8C:
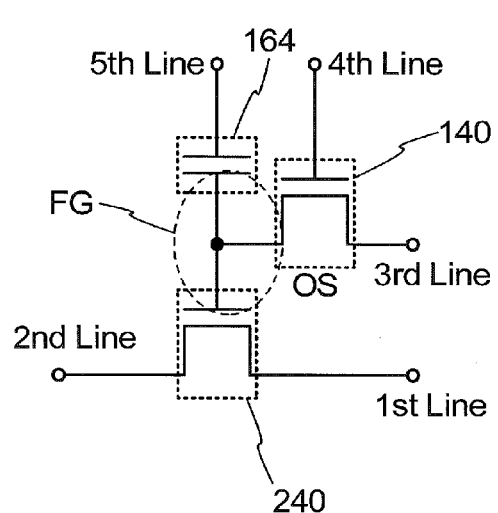

FIGS. 8A to 8C illustrate an example of a configuration of the semiconductor device. FIG. 8A is a cross sectional view of the semiconductor device, and FIG. 8B is a plan view of the semiconductor device. Here, FIG. 8A corresponds to a cross section along line C1-C2 and line D1-D2 in FIG. 8B. FIG. 8C is an example of a diagram of a circuit including the semiconductor device as a memory element. The semiconductor device illustrated in FIGS. 8A and 8B includes a transistor 240 formed using a first semiconductor material in a lower portion, and the transistor 140 described in Embodiment 1 in an upper portion. Note that the transistor 140 includes an oxide semiconductor as a second semiconductor material. In this embodiment, the first semiconductor material is a semiconductor material other than an oxide semiconductor. As the semiconductor material other than an oxide semiconductor, for example, silicon, germanium, silicon germanium, silicon carbide, or gallium arsenide can be used, and a single crystal semiconductor is preferably used. A transistor formed using such a semiconductor material can operate at high speed easily. On the other hand, a transistor formed using an oxide semiconductor enables charge to be held for a long time owing to its characteristics of significantly low off-state current.

The transistor 240 in FIGS. 8A to 8C includes a channel formation region 216 provided in a substrate 200 containing a semiconductor material (e.g., silicon), impurity regions 220 provided so that the channel formation region 216 is provided therebetween, intermetallic compound regions 224 in contact with the impurity regions 220, a gate insulating film 208 provided over the channel formation region 216, and a gate electrode 210 provided over the gate insulating film 208.

As the substrate 200 containing a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate in which a semiconductor film is provided over an insulating substrate such as a glass substrate with an insulating film positioned therebetween.

An element isolation insulating film 206 is formed on the substrate 200 so as to surround the transistor 240, and an insulating film 228 and an insulating film 230 are formed so as to cover the transistor 240. Note that for higher integration, it is preferable that, as in FIG. 8A, the transistor 240 does not have a sidewall insulating film. On the other hand, when the characteristics of the transistor 240 have priority, the sidewall insulating film may be formed on a side surface of the gate electrode 210 and the impurity regions 220 may include a region having a different impurity concentration.

The transistor 240 can be manufactured using silicon, germanium, silicon germanium, silicon carbide, gallium arsenide, or the like. A feature of the transistor 240 is that it can operate at high speed. Thus, when the transistor is used as a reading transistor, data can be read at high speed.

After the transistor 240 is formed, as treatment prior to formation of the transistor 140 and a capacitor 164, CMP treatment is performed on the insulating film 228 and the insulating film 230, whereby an upper surface of the gate electrode 210 is exposed. As the treatment for exposing the upper surface of the gate electrode 210, etching treatment may be employed as an alternative to CMP treatment. Note that it is preferable to planarize the surfaces of the insulating film 228 and the insulating film 230 as much as possible in order to improve the characteristics of the transistor 140.

Next, the oxide semiconductor film 108 is formed by forming an oxide semiconductor film over the gate electrode 210, the insulating film 228, the insulating film 230, and the like and then by selectively etching the oxide semiconductor film. The oxide semiconductor film is formed using the material and the formation process described in Embodiment 1.

Next, a conductive film is formed over the oxide semiconductor film 108, and the source electrode 104a and the drain electrode 104b are formed by selectively etching the conductive film.

The conductive film can be formed by a PVD method such as a sputtering method, or a CVD method such as a plasma CVD method. Further, as a material of the conductive film, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used.

The conductive film may have a single-layer structure or a stacked-layer structure of two or more layers. For example, the conductive film can have a single-layer structure of a titanium film or a titanium nitride film, a single-layer structure of an aluminum film containing silicon, a two-layer structure in which a titanium film is stacked over an aluminum film, a two-layer structure in which a titanium film is stacked over a titanium nitride film, or a three-layer structure in which a titanium film, an aluminum film, and a titanium film are stacked in this order. Note that the conductive film having a single-layer structure of a titanium film or a titanium nitride film has an advantage in that it can be easily processed into the source electrode 104a and the drain electrode 104b having a tapered shape.

The channel length (L) of the transistor 140 in the upper portion is determined by a distance between lower edge portions of the source electrode 104a and the drain electrode 104b. Note that for light exposure for forming a mask in the case of manufacturing a transistor with a channel length (L) of less than 25 nm, light exposure is preferably performed with extreme ultraviolet light whose wavelength is as short as several nanometers to several tens of nanometers.

Next, the gate insulating film 110 is formed in contact with the oxide semiconductor film 108. The gate insulating film 110 is formed using the material and the formation process described in Embodiment 1.

Then, over the gate insulating film 110, a gate electrode 112a is formed in a region overlapping with the oxide semiconductor film 108, and an electrode 112b is formed in a region overlapping with the source electrode 104a.

After the gate insulating film 110 is formed, heat treatment (also referred to as supply of oxygen) is preferably performed in an inert gas atmosphere or an oxygen atmosphere. The temperature of the heat treatment is set in the range of 200° C. to 450° C., preferably 250° C. to 350° C. For example, the heat treatment may be performed at 250° C. for one hour in a nitrogen atmosphere. By performing the heat treatment, variation in electrical characteristics of the transistor can be reduced.

Note that there is no limitation on the timing of the heat treatment for supplying oxygen. For example, the heat treatment for supplying oxygen may be performed after the gate electrode is formed. Heat treatment for dehydration or the like and the heat treatment for supplying oxygen may be performed in succession; the heat treatment for dehydration or the like may also serve as the heat treatment for supplying oxygen; the heat treatment for supplying oxygen may also serve as the heat treatment for dehydration or the like.

As described above, the heat treatment for dehydration or the like and oxygen doping treatment or the heat treatment for supplying oxygen are applied, whereby the oxide semiconductor film 108 can be highly purified so as to contain impurities as little as possible.

The gate electrode 112a and the electrode 112b can be formed by forming a conductive film over the gate insulating film 110 and selectively etching the conductive film.

Next, an insulating film 151 and an insulating film 152 are formed over the gate insulating film 110, the gate electrode 112a, and the electrode 112b. The insulating film 151 and the insulating film 152 can be formed by a sputtering method, a CVD method, or the like. The insulating film 151 and the insulating film 152 can be formed using a material including an inorganic insulating material such as silicon oxide, silicon oxynitride, silicon nitride, hafnium oxide, or aluminum oxide.

Next, an opening reaching the drain electrode 104b is formed in the gate insulating film 110, the insulating film 151, and the insulating film 152. The opening is formed by selective etching with the use of a mask or the like.

After that, an electrode 154 is formed in the opening, and a wiring 156 is formed in contact with the electrode 154 over the insulating film 152.

The electrode 154 can be formed in such a manner, for example, that a conductive film is formed in a region including the opening by a PVD method, a CVD method, or the like and then part of the conductive film is removed by etching, CMP, or the like.

The wiring 156 is formed in such a manner that a conductive film is formed by a PVD method such as a sputtering method or a CVD method such as a plasma CVD method and then the conductive film is patterned. As a material of the conductive film, an element selected from Al, Cr, Cu, Ta, Ti, Mo, and W, an alloy containing any of the above elements as a component, or the like can be used. Any of Mn, Mg, Zr, Be, Nd, and Sc, or a material containing any of these in combination may be used. The details are similar to those of the source electrode 104a, the drain electrode 104b, or the like.

Through the above steps, the transistor 140 including the oxide semiconductor film 108 which is highly purified and the capacitor 164 are completed. The capacitor 164 includes the source electrode 104a, the oxide semiconductor film 108, the gate insulating film 110, and the electrode 112b.

Note that in the capacitor 164 in FIGS. 8A to 8C, with a stack of the oxide semiconductor film 108 and the gate insulating film 110, insulation between the source electrode 104a and the electrode 112b can be adequately secured. Needless to say, the capacitor 164 without the oxide semiconductor film 108 may be employed in order to secure sufficient capacitance. Alternatively, the capacitor 164 may be omitted in the case where a capacitor is not needed.

FIG. 8C is an example of a diagram of a circuit including the semiconductor device as a memory element. In FIG. 8C, one of a source electrode and a drain electrode of the transistor 140, one electrode of the capacitor 164, and the gate electrode of the transistor 240 are electrically connected to one another. A first wiring (1st Line, also referred to as source line) is electrically connected to a source electrode of the transistor 240. A second wiring (2nd Line, also referred to as bit line) is electrically connected to a drain electrode of the transistor 240. A third wiring (3rd Line, also referred to as first signal line) is electrically connected to the other of the source electrode and the drain electrode of the transistor 140. A fourth wiring (4th Line, also referred to as second signal line) is electrically connected to the gate electrode of the transistor 140. A fifth wiring (5th Line, also referred to as word line) is electrically connected to the other electrode of the capacitor 164.

The transistor 140 formed using an oxide semiconductor has significantly low off-state current; therefore, when the transistor 140 is in an off state, a potential of a node (hereinafter node FG) where the one of the source electrode and the drain electrode of the transistor 140, the one electrode of the capacitor 164, and the gate electrode of the transistor 240 are electrically connected to one another can be held for an extremely long time. The capacitor 164 facilitates holding of charge applied to the node FG and reading of data held.

When data is stored in the semiconductor device (writing), the potential of the fourth wiring is set to a potential at which the transistor 140 is turned on, whereby the transistor 140 is turned on. Thus, the potential of the third wiring is supplied to the node FG, and the predetermined amount of charge is accumulated in the node FG. Here, charge for applying either of two different potential levels (hereinafter referred to as low-level charge and high-level charge) is applied. After that, the potential of the fourth wiring is set to a potential at which the transistor 140 is turned off, whereby the transistor 140 is turned off. This makes the node FG floating and the predetermined amount of electric charge is held in the node FG. The predetermined amount of charge is thus accumulated and held in the node FG, whereby the memory cell can store data.

Since the off-state current of the transistor 140 is extremely low, the charge applied to the node FG is held for a long time. Thus, refresh operation becomes unnecessary or the frequency of the refresh operation can be extremely lowered, which leads to a sufficient reduction in power consumption. Moreover, stored data can be held for a long period even when power is not supplied.

When stored data is read out (reading), while a predetermined potential (fixed potential) is supplied to the first wiring, an appropriate potential (reading potential) is supplied to the fifth wiring, whereby the transistor 240 changes its state depending on the amount of charge held in the node FG This is because in general, when the transistor 240 is an n-channel transistor, an apparent threshold value $V_{th\_H}$ of the transistor 240 in the case where the high-level charge is held in the node FG is lower than an apparent threshold value $V_{th\_L}$ of the transistor 240 in the case where the low-level charge is held in the node FG. Here, an apparent threshold value refers to a potential of the fifth wiring, which is needed to turn on the transistor 240. Thus, by setting the potential of the fifth wiring to a potential $V_0$ which is between $V_{th\_H}$ and $V_{th\_L}$, charge held in the node FG can be determined. For example, in the case where the high-level charge is applied in writing, when the potential of the fifth wiring is set to $V_0$ ($>V_{th\_H}$), the transistor 240 is turned on. In the case where the low-level charge is applied in writing, even when the potential of the fifth wiring is set to $V_0$ ($<V_{th\_L}$), the transistor 240 remains in an off state. In such a manner, by controlling the potential of the fifth wiring and determining whether the transistor 240 is in an on state or off state (reading out the potential of the second wiring), stored data can be read out.

Further, in order to rewrite stored data, a new potential is supplied to the node FG that is holding the predetermined amount of charge applied in the above writing, so that the charge for new data is held in the node FG. Specifically, the potential of the fourth wiring is set to a potential at which the transistor 140 is turned on, whereby the transistor 140 is turned on. Thus, the potential of the third wiring (potential for new data) is supplied to the node FG, and the predetermined amount of charge is accumulated in the node FG After that, the potential of the fourth wiring is set to a potential at which the transistor 140 is turned off, whereby the transistor 140 is turned off. Thus, charge for the new data is held in the node FG In other words, while the predetermined amount of charge applied in the first writing is held in the node FG, the same operation (second writing) as in the first writing is performed, whereby the stored data can be overwritten.

When the oxide semiconductor film 108 in which holes have a larger effective mass than electrons is used in the transistor 140 described in this embodiment, the off-state current of the transistor 140 can be sufficiently decreased. Further, by using such a transistor, a highly reliable semiconductor device in which stored data can be held for an extremely long time can be obtained.

In the semiconductor device described in this embodiment, the transistor 240 and the transistor 140 overlap with each other; therefore, a semiconductor device whose integration degree is sufficiently improved can be obtained.

The configuration, method, and the like described in this embodiment can be combined as appropriate with any of the configurations, methods, and the like described in the other embodiments.

(Embodiment 3)

In this embodiment, a central processing unit (CPU) at least part of which includes the transistor disclosed above in Embodiment 1 will be described as an example of a semiconductor device.

Figure 9A:
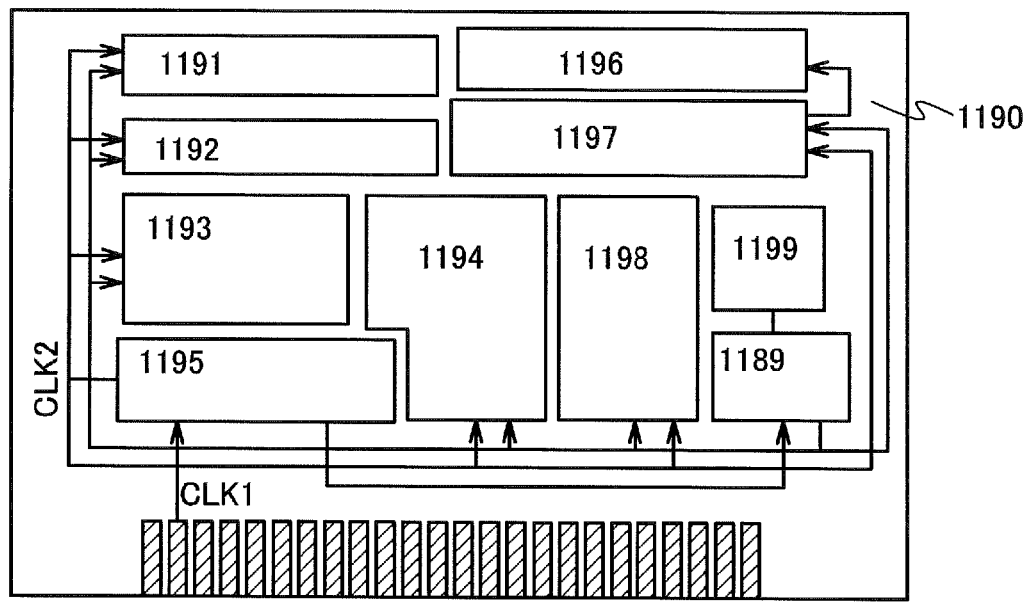
FIGS. 9A to 9C are a block diagram illustrating an embodiment of a semiconductor device and partial circuit diagrams thereof.

FIG. 9A is a block diagram illustrating a specific configuration of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM interface 1189 may be provided on a separate chip. Obviously, the CPU illustrated in FIG. 9A is just an example in which the configuration is simplified, and actual CPUs may have various configurations depending on the application.

An instruction input to the CPU through the bus interface 1198 is input to the instruction decoder 1193, decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls based on the decoded instruction. Specifically, the ALU controller 1192 generates signals for controlling the operation of the ALU 1191. While the CPU is executing a program, the interrupt controller 1194 processes an interrupt request from an external input/output device or a peripheral circuit on the basis of its priority or a mask state. The register controller 1197 generates an address of the register 1196, and reads and writes data from and to the register 1196 depending on the state of the CPU.

The timing controller 1195 generates signals for controlling timing of operation of the ALU 1191, the ALU controller 1192, the instruction decoder 1193, the interrupt controller 1194, and the register controller 1197. For example, the timing controller 1195 is provided with an internal clock generator for generating an internal clock signal CLK2 based on a reference clock signal CLK1, and supplies the internal clock signal CLK2 to the above-mentioned various circuits.

In the CPU illustrated in FIG. 9A, a memory cell is provided in the register 1196. The memory cell described above in Embodiment 2 can be used in the register 1196.

In the CPU illustrated in FIG. 9A, the register controller 1197 selects operation of holding data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data in the capacitor is rewritten, and supply of the power supply voltage to the memory cell in the register 1196 can be stopped.

Figure 9B:
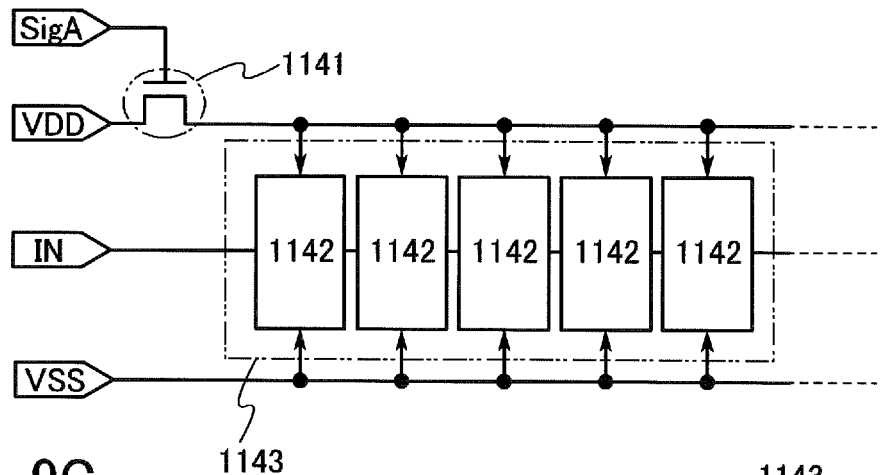
Figure 9C:
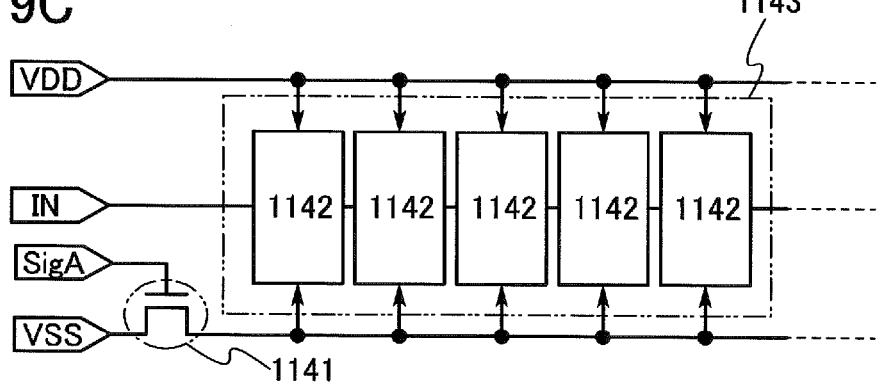

The power supply can be stopped by a switching element provided between a memory cell group and a node to which a power supply potential VDD or a power supply potential VSS is supplied, as illustrated in FIG. 9B or FIG. 9C. Circuits illustrated in FIGS. 9B and 9C are described below.

FIGS. 9B and 9C each illustrate an example of a configuration of the storage circuit described above in Embodiment 2 as a switching element for controlling supply of a power supply potential to a memory cell.

The storage device illustrated in FIG. 9B includes a switching element 1141 and a memory cell group 1143 including a plurality of memory cells 1142. Specifically, as each of the memory cells 1142, the memory cell described in Embodiment 2 can be used. Each of the memory cells 1142 included in the memory cell group 1143 is supplied with a high-level power supply potential VDD through the switching element 1141. Further, each of the memory cells 1142 included in the memory cell group 1143 is supplied with a potential of a signal IN and a low-level power supply potential VSS.

As the switching element 1141 in FIG. 9B, the transistor described above in Embodiment 1 is used. The switching of the transistor is controlled by a signal SigA supplied to a gate electrode thereof.

Note that FIG. 9B illustrates a configuration in which the switching element 1141 includes only one transistor; however, one embodiment of the present invention is not limited thereto. The switching element 1141 may include a plurality of transistors. In the case where the switching element 1141 includes a plurality of transistors functioning as switching elements, the plurality of transistors may be connected to each other in parallel, in series, or in combination of parallel connection and series connection.

Although the switching element 1141 controls the supply of the high-level power supply potential VDD to each of the memory cells 1142 included in the memory cell group 1143 in FIG. 9B, the switching element 1141 may control the supply of the low-level power supply potential VSS.

FIG. 9C illustrates an example of a storage device in which each of the memory cells 1142 included in the memory cell group 1143 is supplied with the low-level power supply potential VSS through the switching element 1141. The supply of the low-level power supply potential VSS to each of the memory cells 1142 included in the memory cell group 1143 can be controlled by the switching element 1141.

When a switching element is provided between a memory cell group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that power consumption can be reduced.

Although the CPU is given as an example here, the transistor can also be applied to an LSI such as a digital signal processor (DSP), a custom LSI, or a field programmable gate array (FPGA).

This embodiment can be implemented in appropriate combinations with either of the above embodiments.

(Embodiment 4)

A semiconductor device disclosed in this specification can be applied to a variety of electronic devices (including an amusement machine). Examples of electronic devices include the following: display devices such as televisions and monitors, lighting devices, desktop or laptop personal computers, word processors, image reproduction devices which reproduce still images or moving images stored in recording media such as digital versatile discs (DVDs), portable CD players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, air-conditioning systems such as air conditioners, dish washing machines, dish drying machines, clothes dryers, futon dryers, electric refrigerators, electric freezers, electric refrigerator-freezers, freezers for preserving DNA, smoke detectors, radiation counters, medical equipment such as dialyzers. Further examples include industrial equipment such as guide lights, traffic lights, belt conveyors, elevators, escalators, industrial robots, and power storage systems. In addition, oil engines, moving objects driven by electric motors using power from non-aqueous secondary batteries, and the like are also included in the range of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 10A to 10C.

Figure 10A:
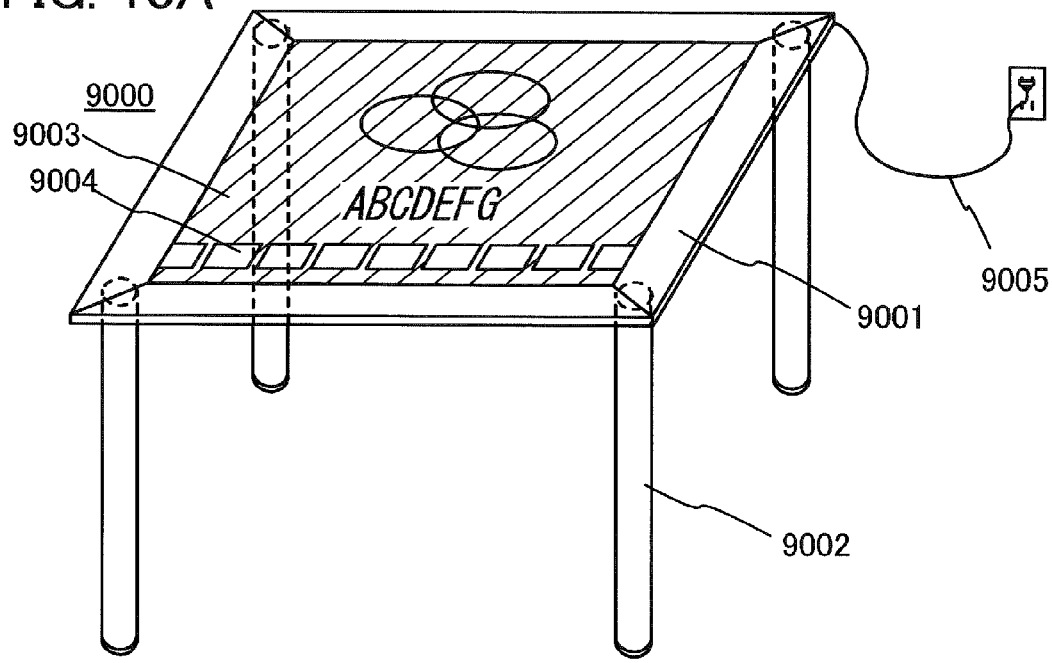
FIGS. 10A to 10C illustrate electronic devices.
Figure 10B:
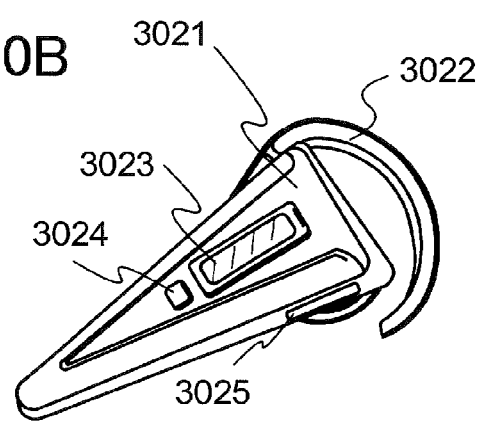
Figure 10C:
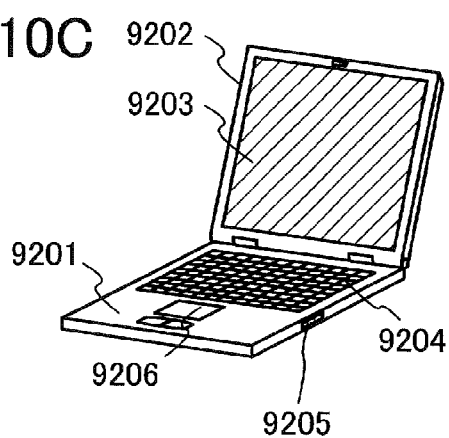

FIG. 10A illustrates a table 9000 having a display portion. In the table 9000, a display portion 9003 is incorporated in a housing 9001 and an image can be displayed on the display portion 9003. Note that the housing 9001 is supported by four leg portions 9002. Further, the housing 9001 is provided with a power cord 9005 for supplying power.

The transistor described in Embodiment 1 can be used in the display portion 9003 so that power consumption of the electronic device can be reduced.

The display portion 9003 has a touch-input function. When a user touches displayed buttons 9004 which are displayed on the display portion 9003 of the table 9000 with his/her finger or the like, the user can carry out operation of the screen and input of information. Further, when the table is capable of communicating with other home appliances or control the home appliances, the table 9000 may function as a control device which controls the home appliances by operation on the screen. For example, with the use of a semiconductor device having an image sensing function, the display portion 9003 can have a touch-input function.

Further, the screen of the display portion 9003 can be placed perpendicular to a floor with a hinge provided for the housing 9001; thus, the table 9000 can also be used as a television device. When a television device having a large screen is set in a small room, an open space is reduced; however, when a display portion is incorporated in a table, a space in the room can be efficiently used.

FIG. 10B illustrates a portable music player, which includes, in a main body 3021, a display portion 3023, a fixing portion 3022 with which the main body is worn on the ear, a speaker, an operation button 3024, an external memory slot 3025, and the like. When the transistor described in Embodiment 1 or the memory described in Embodiment 2 is used in a memory or a CPU incorporated in the main body 3021, power consumption of the portable music player can be further reduced.

Furthermore, when the portable music player illustrated in FIG. 10B has an antenna, a microphone function, or a wireless communication function and is used with a mobile phone, a user can talk on the phone wirelessly in a hands-free way while driving a car or the like.

FIG. 10C illustrates a computer, which includes a main body 9201 including a CPU, a housing 9202, a display portion 9203, a keyboard 9204, an external connection port 9205, a pointing device 9206, and the like. The computer is manufactured using a semiconductor device manufactured according to one embodiment of the present invention for the display portion 9203. When the CPU described in Embodiment 3 is used, power consumption of the computer can be reduced.

Figure 11A:
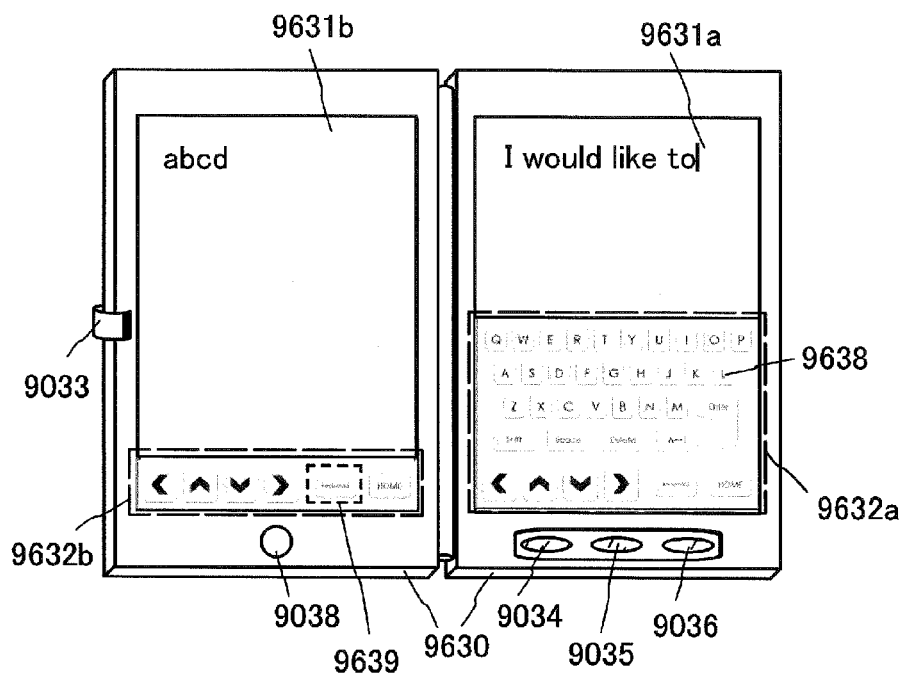
FIGS. 11A to 11C illustrate an electronic device.
Figure 11B:
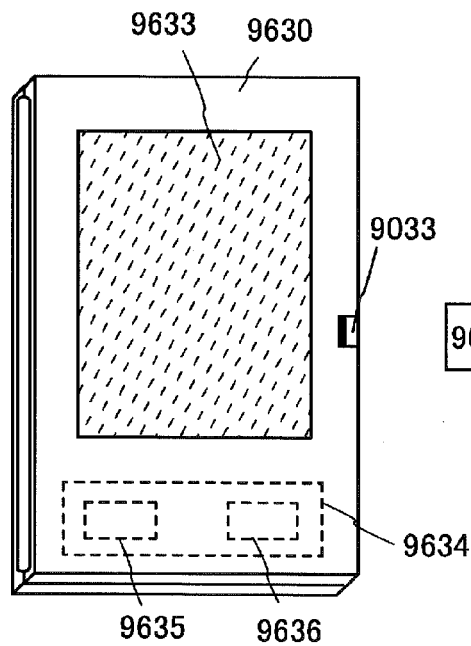

FIGS. 11A and 11B illustrate a foldable tablet terminal. The tablet terminal is opened in FIG. 11A. The tablet terminal includes a housing 9630, a display portion 9631a, a display portion 9631b, a display mode switch 9034, a power switch 9035, a power saver switch 9036, a clasp 9033, and an operation switch 9038.

In such a portable device illustrated in FIGS. 11A and 11B, a memory is used for temporarily storing image data or the like. For example, the semiconductor device described in Embodiment 2 can be used as a memory. By employing the semiconductor device described in the above embodiment for the memory, data can be written and read at high speed and held for a long time, and power consumption can be sufficiently reduced.

Part of the display portion 9631a can be a touch panel region 9632a and data can be input when a displayed operation key 9638 is touched. Although a structure in which a half region in the display portion 9631a has only a display function and the other half region also has a touch panel function is shown as an example, the display portion 9631a is not limited to the structure. The whole region in the display portion 9631a may have a touch panel function. For example, the display portion 9631a can display keyboard buttons in the whole region to be a touch panel, and the display portion 9631b can be used as a display screen.

As in the display portion 9631a, part of the display portion 9631b can be a touch panel region 9632b. When a keyboard display switching button 9639 displayed on the touch panel is touched with a finger, a stylus, or the like, a keyboard can be displayed on the display portion 9631b.

Touch input can be performed in the touch panel region 9632a and the touch panel region 9632b at the same time.

The display mode switch 9034 can switch the display between portrait mode, landscape mode, and the like, and between monochrome display and color display, for example. The power saver switch 9036 can control display luminance in accordance with the amount of external light in use of the tablet terminal detected by an optical sensor incorporated in the tablet terminal In addition to the optical sensor, another detection device including a sensor for detecting inclination, such as a gyroscope or an acceleration sensor, may be incorporated in the tablet terminal.

Note that FIG. 11A shows an example in which the display portion 9631a and the display portion 9631b have the same display area; however, without limitation, one of the display portions may be different from the other display portion in size and display quality. For example, one display panel may be capable of higher-definition display than the other display panel.

The tablet terminal is closed in FIG. 11B. The tablet terminal includes the housing 9630, a solar cell 9633, a charge and discharge control circuit 9634, a battery 9635, and a DCDC converter 9636. In FIG. 11B, a structure including the battery 9635 and the DCDC converter 9636 is illustrated as an example of the charge and discharge control circuit 9634.

Since the tablet terminal is foldable, the housing 9630 can be closed when the tablet terminal is not used. As a result, the display portion 9631a and the display portion 9631b can be protected; thus, a tablet terminal which has excellent durability and excellent reliability in terms of long-term use can be provided.

In addition, the tablet terminal illustrated in FIGS. 11A and 11B can have a function of displaying a variety of kinds of data (e.g., a still image, a moving image, and a text image), a function of displaying a calendar, a date, the time, or the like on the display portion, a touch-input function of operating or editing the data displayed on the display portion by touch input, a function of controlling processing by a variety of kinds of software (programs), and the like.

The solar cell 9633 provided on a surface of the tablet terminal can supply power to the touch panel, the display portion, a video signal processing portion, or the like. Note that the solar cell 9633 can be provided on one or both surfaces of the housing 9630 and the battery 9635 can be charged efficiently. The use of a lithium ion battery as the battery 9635 is advantageous in downsizing or the like.

Figure 11C:
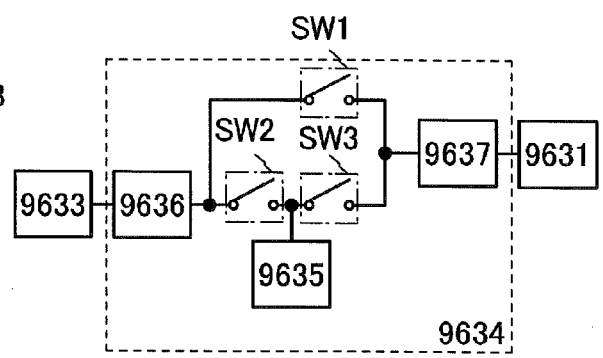

The structure and the operation of the charge and discharge control circuit 9634 illustrated in FIG. 11B will be described with reference to a block diagram in FIG. 11C. The solar cell 9633, the battery 9635, the DCDC converter 9636, a converter 9637, switches SW1 to SW3, and a display portion 9631 are illustrated in FIG. 11C, and the battery 9635, the DCDC converter 9636, the converter 9637, and the switches SW1 to SW3 correspond to the charge and discharge control circuit 9634 illustrated in FIG. 11B.

First, an example of the operation in the case where power is generated by the solar cell 9633 using external light is described. The voltage of power generated by the solar cell is stepped up or down by the DCDC converter 9636 so that the power has a voltage for charging the battery 9635. Then, when the power from the solar cell 9633 is used for the operation of the display portion 9631, the switch SW1 is turned on and the voltage of the power is stepped up or down by the converter 9637 so as to be a voltage needed for the display portion 9631. In addition, when display on the display portion 9631 is not performed, the switch SW1 is turned off and the switch SW2 is turned on so that the battery 9635 may be charged.

Note that the solar cell 9633 is described as an example of a power generation means; however, without limitation, the battery 9635 may be charged using another power generation means such as a piezoelectric element or a thermoelectric conversion element (Peltier element). For example, a non-contact electric power transmission module which transmits and receives power wirelessly (without contact) to charge the battery 9635, or a combination of the solar cell 9633 and another means for charge may be used.

Figure 12A:
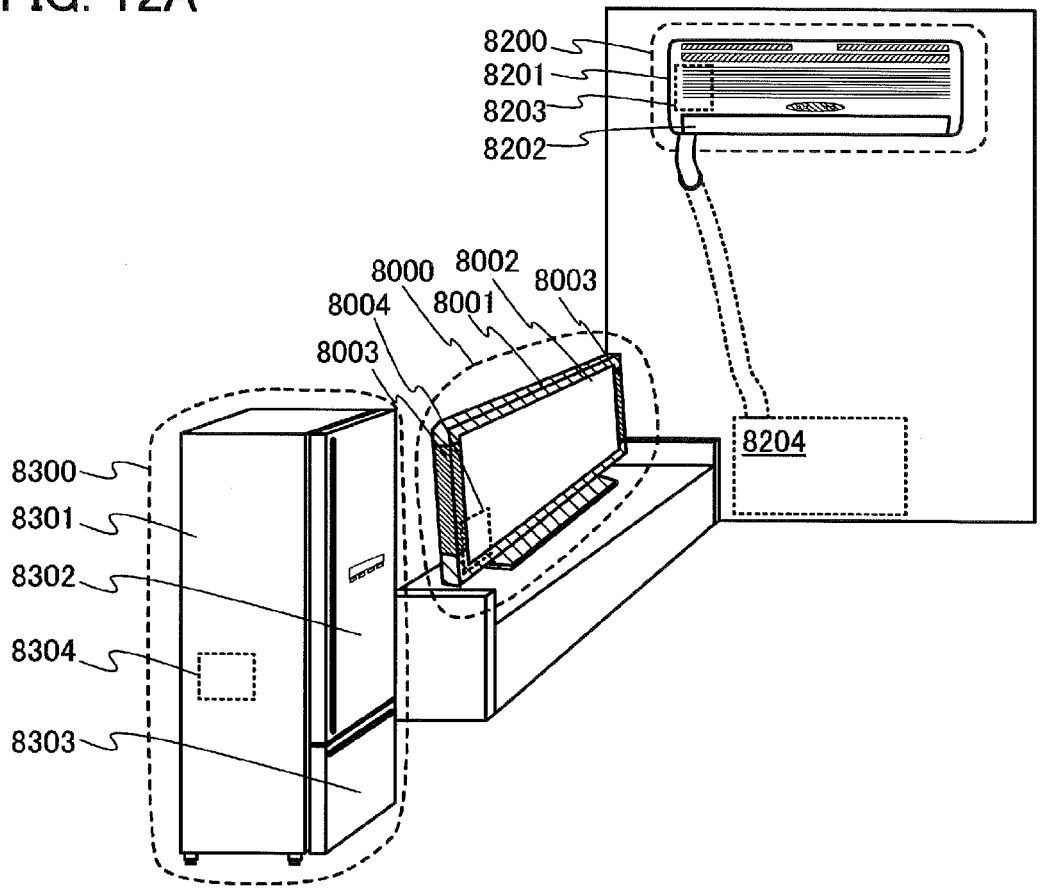
FIGS. 12A to 12C illustrate electronic devices.

In a television device 8000 in FIG. 12A, a display portion 8002 is incorporated in a housing 8001. The display portion 8002 displays an image and a speaker portion 8003 can output sound. The transistor described in Embodiment 1 can be used as a switching element of the display portion 8002 or in a driver circuit.

A semiconductor display device such as a liquid crystal display device, a light-emitting device in which a light-emitting element such as an organic EL element is provided in each pixel, an electrophoresis display device, a digital micromirror device (DMD), a plasma display panel (PDP), or the like can be used in the display portion 8002.

The television device 8000 may be provided with a receiver, a modem, and the like. With the receiver, the television device 8000 can receive general television broadcasting. Furthermore, when the television device 8000 is connected to a communication network by wired or wireless connection via the modem, one-way (from a transmitter to a receiver) or two-way (between a transmitter and a receiver, between receivers, or the like) data communication can be performed.

In addition, the television device 8000 may include a CPU for performing information communication or a memory.

The memory described in Embodiment 2 or the CPU described in Embodiment 3 can be used in the television device 8000.

In FIG. 12A, an air conditioner including an indoor unit 8200 and an outdoor unit 8204 is an example of an electric device including the CPU of Embodiment 3. Specifically, the indoor unit 8200 includes a housing 8201, a ventilation duct 8202, a CPU 8203, and the like. FIG. 12A shows the case where the CPU 8203 is provided in the indoor unit 8200; the CPU 8203 may be provided in the outdoor unit 8204. Alternatively, the CPU 8203 may be provided in both the indoor unit 8200 and the outdoor unit 8204. Since the CPU described in Embodiment 3 is formed using an oxide semiconductor, an air conditioner which consumes less power can be provided with the use of the CPU.

In FIG. 12A, an electric refrigerator-freezer 8300 is an example of an electric device which is provided with the CPU formed using an oxide semiconductor. Specifically, the electric refrigerator-freezer 8300 includes a housing 8301, a refrigerator door 8302, a freezer door 8303, a CPU 8304, and the like. The CPU 8304 is provided in the housing 8301 in FIG. 12A. When the CPU described in Embodiment 3 is used as the CPU 8304 of the electric refrigerator-freezer 8300, power saving can be achieved.

Figure 12B:
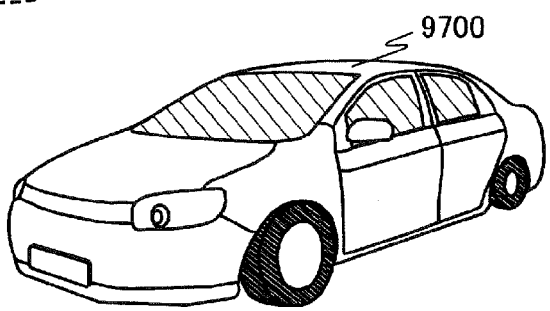
Figure 12C:
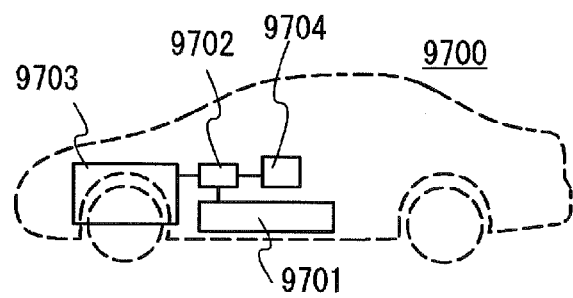

FIGS. 12B and 12C illustrate an example of an electric vehicle which is an example of an electric device. An electric vehicle 9700 is equipped with a secondary battery 9701. The output of power of the secondary battery 9701 is controlled by a control circuit 9702 and the power is supplied to a driving device 9703. The control circuit 9702 is controlled by a processing unit 9704 including a ROM, a RAM, a CPU, or the like which is not illustrated. When the CPU described in Embodiment 3 is used as the CPU in the electric vehicle 9700, power saving can be achieved.

The driving device 9703 includes a DC motor or an AC motor either alone or in combination with an internal-combustion engine. The processing unit 9704 outputs a control signal to the control circuit 9702 based on input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This embodiment can be implemented in appropriate combinations with any of the other embodiments.

[Example 1]

Figure 13:
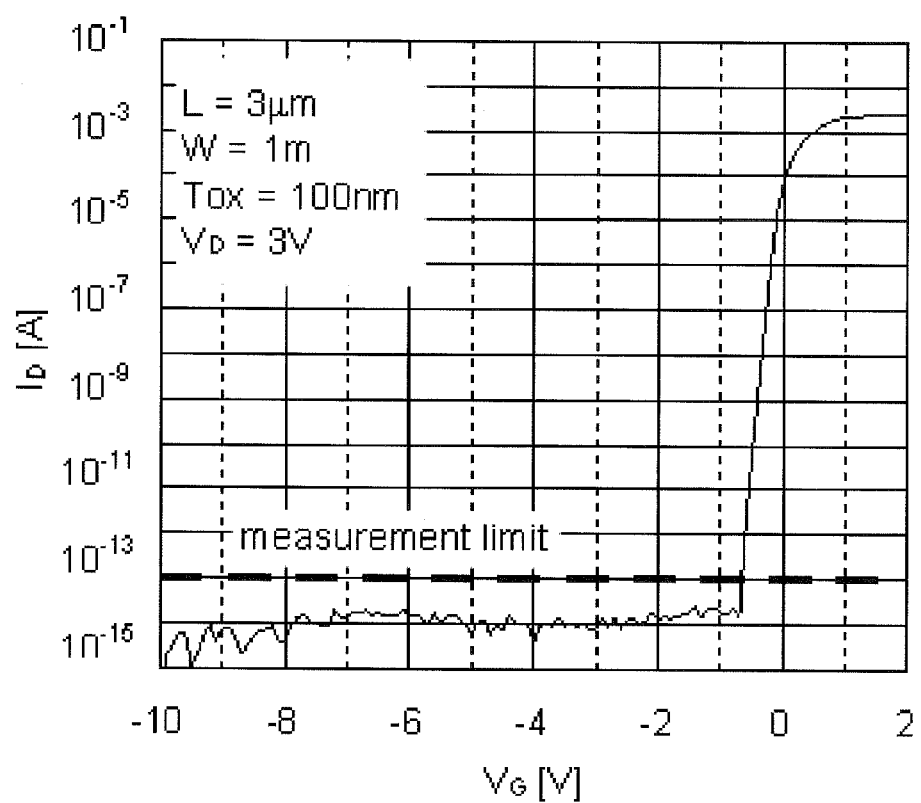
FIG. 13 is a graph showing a Vg-Id curve of a transistor.

An example of a Vg-Id curve of the transistor obtained through the manufacturing process in Embodiment 1 is shown in FIG. 13. Note that the channel width of the transistor is 1 m and the channel length is 3 μm for detection of the off-state current. And the transistor was measured at a room temperature.

Figure 16:
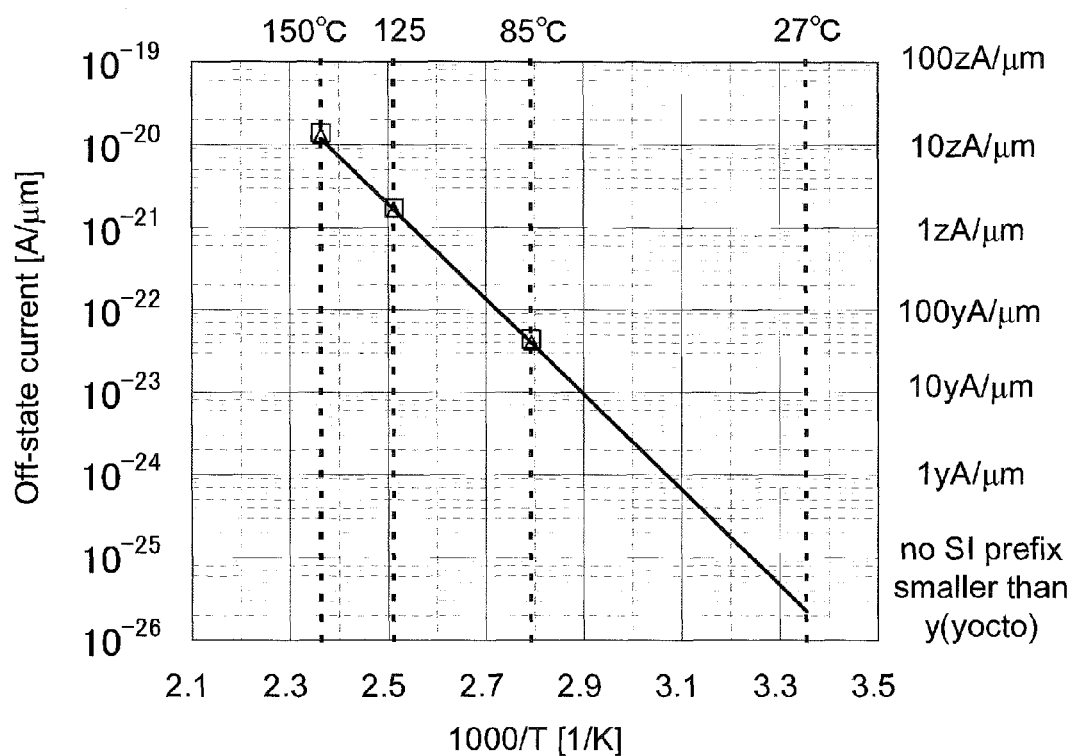
FIG. 16 is a graph showing an off-state current of a transistor.

As shown in FIG. 13, it could be understood that the off-state current is $1\times10^{-13}$ A or lower, or $1\times10^{-14}$ A or lower when the gate voltage is equal to or about −3V. This is equivalent to an off-state current per micrometer in channel width of $1\times10^{-19}$ A/μm (100 zA/μm) or lower, or $1\times10^{-20}$ A/μm (10 zA/μm) or lower. Meanwhile, the off-state current was below the lower measurement limit ($1\times10^{-13}$ A) of a semiconductor parameter analyzer and it was impossible to estimate its exact value. However, by precise evaluation by measurement for a long time, a value of about 10 zA (zeptoampere) per micrometer in channel width at 150° C., a value of about 2 zA (zeptoampere) per micrometer in channel width at 125° C., and a value of about 50 yA (yoctoampere) per micrometer in channel width at 85° C. were obtained. An Arrhenius plot obtained by the measurement is shown in a graph of FIG. 16. According to the graph, it can be estimated that the off-state current of the transistor at 27° C. is $2\times10^{-26}$ A/μm The gate insulating film is 100 nm thick, the drain voltage is 3 V, and the gate voltage is −3 V. Note that such a low off-state current has been theoretically verified as described in Embodiment 1.

This application is based on Japanese Patent Application serial no. 2012-022514 filed with Japan Patent Office on Feb. 3, 2012 and Japanese Patent Application serial no. 2012-058036 filed with Japan Patent Office on Mar. 14, 2012, the entire contents of which are hereby incorporated by reference.

What is claimed is:

1. A semiconductor device comprising a transistor, the transistor comprising:

a gate electrode layer;

an oxide semiconductor layer including a hole whose effective mass is 5 or more times an effective mass of an electron in the oxide semiconductor layer;

a gate insulating layer between the gate electrode layer and the oxide semiconductor layer;

a source electrode layer electrically connected to the oxide semiconductor layer; and a drain electrode layer electrically connected to the oxide semiconductor layer, wherein an effective mass of the hole in the oxide semiconductor layer along an a-axis direction is greater than an effective mass of the hole along a c-axis direction.

2. The semiconductor device according to claim 1, wherein an effective mass of the hole in the oxide semiconductor layer along a b-axis direction is greater than the effective mass of the hole along the a-axis direction.

3. The semiconductor device according to claim 1, wherein a channel length of the transistor is greater than or equal to 5 nm and less than or equal to 500 nm.

4. The semiconductor device according to claim 1, wherein a band gap of the oxide semiconductor layer is greater than or equal to 2 eV and less than or equal to 4 eV.

5. The semiconductor device according to claim 1, wherein a carrier density in a channel formation region of the transistor is greater than or equal to $10^{-10}$ /cm$^3$ and less than $10^{17}$ /cm$^3$.

6. The semiconductor device according to claim 1, wherein the oxide semiconductor layer contains at least indium and contains one or more elements selected from the group consisting of gallium, tin, titanium, zirconium, hafnium, zinc, and germanium.

7. The semiconductor device according to claim 1, wherein the source electrode layer and the drain electrode layer comprise tungsten.

8. The semiconductor device according to claim 1, wherein a ratio of the effective mass of the hole with respect to a mass of a bare electron is 1 or more.

9. The semiconductor device according to claim 1, wherein a difference between an ionization potential of the oxide semiconductor layer and a work function of a material in the drain electrode layer is greater than or equal to 2.8 eV.

10. A semiconductor device comprising:
a first transistor comprising:
- a gate electrode layer;
- an oxide semiconductor layer including a hole whose effective mass is 5 or more times an effective mass of an electron in the oxide semiconductor layer;
- a gate insulating layer between the gate electrode layer and the oxide semiconductor layer;
- a source electrode layer electrically connected to the oxide semiconductor layer; and
- a drain electrode layer electrically connected to the oxide semiconductor layer, a second transistor electrically connected to the first transistor, wherein a channel formation region of the second transistor comprises any of silicon, germanium, silicon germanium, silicon carbide, and gallium arsenide, and wherein an effective mass of the hole in the oxide semiconductor layer along an a-axis direction is greater than an effective mass of the hole along a c-axis direction.

11. The semiconductor device according to claim 10, wherein an effective mass of the hole in the oxide semiconductor layer along a b-axis direction is greater than the effective mass of the hole along the a-axis direction.

12. The semiconductor device according to claim 10, wherein a channel length of the first transistor is greater than or equal to 5 nm and less than or equal to 500 nm.

13. The semiconductor device according to claim 10, wherein a band gap of the oxide semiconductor layer is greater than or equal to 2 eV and less than or equal to 4 eV.

14. The semiconductor device according to claim 10, wherein a carrier density in a channel formation region of the first transistor is greater than or equal to $10^{-10}$ /cm$^3$ and less than $10^{17}$ /cm$^3$.

15. The semiconductor device according to claim 10, wherein the oxide semiconductor layer contains at least indium and contains one or more elements selected from the group consisting of gallium, tin, titanium, zirconium, hafnium, zinc, and germanium.

16. The semiconductor device according to claim 10, wherein the source electrode layer and the drain electrode layer comprise tungsten.

17. The semiconductor device according to claim 10, wherein a ratio of the effective mass of the hole with respect to a mass of a bare electron is 1 or more.

18. The semiconductor device according to claim 10, wherein a difference between an ionization potential of the oxide semiconductor layer and a work function of a material in the drain electrode layer is greater than or equal to 2.8 eV.

19. The semiconductor device according to claim 10, wherein a probability of electron-hole pair generation in the first transistor is 35 orders of magnitude smaller than that in the second transistor.

20. The semiconductor device according to claim 10, wherein an injection of a thermally excited electron into a channel in the first transistor is 17 orders of magnitude smaller than that in the second transistor.

21. The semiconductor device according to claim 10, wherein an injection of a thermally excited hole into a channel in the first transistor is 27 orders of magnitude smaller than that in the second transistor.

22. The semiconductor device according to claim 10, wherein a probability of hole tunneling in the first transistor is 13 orders of magnitude smaller than that in the second transistor.

* * * * *